US012777702B2

(12) United States Patent
Edwards

(10) Patent No.: US 12,777,702 B2
(45) Date of Patent: Oct. 27, 2026

(54) SEMICONDUCTOR DEVICE WITH GATE ELECTRODE HAVING OPPOSITE TYPE DOPING AT DRAIN END AND SOURCE END INCLUDING A SELF-ALIGNED DWELL IMPLANT

(71) Applicant: Texas Instruments Incorporated, Dallas, TX (US)

(72) Inventor: Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 373 days.

(21) Appl. No.: 18/477,916

(22) Filed: Sep. 29, 2023

(65) Prior Publication Data

US 2025/0113585 A1 Apr. 3, 2025

(51) Int. Cl.
*H10D 64/66* (2025.01)
*H10D 30/01* (2025.01)
(Continued)

(52) U.S. Cl.
CPC ....... *H10D 64/671* (2025.01); *H10D 30/0281* (2025.01); *H10D 30/65* (2025.01); *H10D 62/116* (2025.01); *H10D 64/0131* (2026.01); *H10D 64/111* (2025.01); *H10D 64/663* (2025.01); *H10P 30/204* (2026.01); (Continued)

(58) Field of Classification Search
CPC ............. H10D 64/0131; H10D 64/671; H10D 30/0221; H10D 30/0281; H10D 30/603; H10D 30/65; H10D 62/116; H10D 62/151; H10D 62/307; H10D 64/111; H10D 64/516; H10D 64/663; H10D 62/109; H10D 89/813; H10D 64/115; H10D 30/0285; H10D 89/811; H10D 64/62; H10D 62/83; H10D 30/655; H10D 62/371; H10D 64/661; H10D 64/112; H10P 30/204; H10P 30/21; H10P 30/22; H10P 32/302
See application file for complete search history.

(56) References Cited

U.S. PATENT DOCUMENTS

| | | | | |
|---|---|---|---|---|
| 8,258,586 B1 * | 9/2012 | Mitchell | .............. | H10D 64/671 257/528 |
| 10,141,398 B1 * | 11/2018 | Tsai | ..................... | H10D 62/112 |

(Continued)

*Primary Examiner* — Mouloucoulaye Inoussa
(74) *Attorney, Agent, or Firm* — Andrew R. Ralston; Charles F. Koch

(57) ABSTRACT

Disclosed examples include microelectronic devices, e.g. integrated circuits, which include a source region and a drain region extending into a semiconductor substrate, the semiconductor substrate having a second conductivity type, the source region and drain region having an opposite first conductivity type. A channel region having the second conductivity type extends between the source region and the drain region. A gate electrode over the channel region has a first portion and a second portion. The first portion has the second conductivity type and a first dopant concentration. The second portion extends from the first portion toward the source region and has the second conductivity type and a second higher dopant concentration. A self-aligned implant is used to simultaneously implant dopants near the source end of the gate electrode and in the semiconductor substrate near the source region.

19 Claims, 24 Drawing Sheets

(51) Int. Cl.

| | |
|---|---|
| ***H10D 30/65*** | (2025.01) |
| ***H10D 62/10*** | (2025.01) |
| ***H10D 64/00*** | (2025.01) |
| ***H10D 64/01*** | (2025.01) |
| ***H10P 30/20*** | (2026.01) |
| ***H10P 30/22*** | (2026.01) |
| ***H10P 32/30*** | (2026.01) |

(52) U.S. Cl.
CPC .............. *H10P 30/21* (2026.01); *H10P 30/22* (2026.01); *H10P 32/302* (2026.01)

(56) References Cited

U.S. PATENT DOCUMENTS

| | | | | | |
|---|---|---|---|---|---|
| 10,937,872 | B1 * | 3/2021 | Chen | H10D 30/603 | |
| 2006/0001050 | A1 * | 1/2006 | Wang | H10D 64/671 | 257/E29.268 |
| 2010/0006934 | A1 * | 1/2010 | Su | H10D 30/603 | 257/341 |
| 2010/0164018 | A1 * | 7/2010 | Lee | H10D 30/601 | 257/408 |
| 2010/0267184 | A1 * | 10/2010 | Noh | H10P 30/204 | 438/58 |
| 2013/0181286 | A1 * | 7/2013 | Zhang | H10D 64/671 | 257/E29.256 |
| 2013/0341714 | A1 * | 12/2013 | Jang | H10D 64/111 | 257/335 |
| 2015/0137230 | A1 * | 5/2015 | Liao | H10D 30/65 | 438/286 |
| 2015/0187938 | A1 * | 7/2015 | Tang | H10D 30/605 | 257/408 |
| 2016/0043188 | A1 * | 2/2016 | Chu | H10D 64/671 | 257/66 |
| 2016/0172489 | A1 * | 6/2016 | Chen | H10D 30/603 | 438/286 |
| 2016/0197110 | A1 * | 7/2016 | Hung | H10F 39/80377 | 257/229 |
| 2016/0365422 | A1 * | 12/2016 | Chen | H10D 64/663 | |
| 2019/0378908 | A1 * | 12/2019 | Park | H10D 30/65 | |
| 2022/0130975 | A1 * | 4/2022 | Lin | H01L 21/76224 | |
| 2022/0181461 | A1 * | 6/2022 | Tamura | G05F 1/575 | |
| 2022/0393027 | A1 * | 12/2022 | Koshimizu | H10D 84/153 | |
| 2023/0023179 | A1 * | 1/2023 | Ji | H10D 30/65 | |

* cited by examiner

SEMICONDUCTOR DEVICE WITH GATE ELECTRODE HAVING OPPOSITE TYPE DOPING AT DRAIN END AND SOURCE END INCLUDING A SELF-ALIGNED DWELL IMPLANT

CROSS-REFERENCE TO RELATED APPLICATIONS

This application is related to co-owned U.S. patent application Ser. No. 18/459,065, filed Aug. 31, 2023, and incorporated herein by reference in its entirety.

TECHNICAL FIELD

This disclosure relates to the field of microelectronic devices. More particularly, but not exclusively, this disclosure relates to gated devices such as MOS transistors.

BACKGROUND

Semiconductor components are being continually improved to reliably operate with smaller feature sizes. Fabricating semiconductor devices that have increasingly higher performance while meeting reliability specifications presents diverse challenges.

SUMMARY

This summary is provided to introduce a brief overview of disclosed concepts in a simplified form that are further described below in the detailed description including the drawings provided. This summary is not intended to limit the scope of the disclosure or the claims.

Disclosed examples include microelectronic devices, e.g. Integrated circuits. One example includes a microelectronic device including source and drain regions having a first conductivity type extending into a semiconductor substrate having an opposite second conductivity type. A channel region having the second conductivity type extends to a surface of the substrate between the source region and the drain region. A gate electrode over the channel region has first and second portions with the second conductivity type, the first portion having a first dopant concentration, and the second portion extending from the first portion toward the source region and having a second higher dopant concentration. The second higher dopant concentration increases from the first portion toward the source region.

Another example provides a method of forming a microelectronic device. A gate electrode is formed over a semiconductor substrate, the gate electrode having a source end and a drain end. A first portion of the gate electrode extends from the drain end toward the source end, a second portion of the gate electrode extends from the first portion toward the source end, and a third portion of the gate electrode extends from the second portion to the source end. A first dopant of a first conductivity type is simultaneously implanted into the third portion of the gate electrode and into the semiconductor substrate adjacent the third portion. A second dopant of an opposite second conductivity type is simultaneously implanted in the third portion of the gate electrode and in the semiconductor substrate adjacent the third portion. The gate electrode is annealed thereby diffusing the dopants of the second conductivity type from the third portion of the gate electrode into the second portion of the gate electrode such that the second portion of the gate electrode has a horizontal dopant concentration gradient between the first and third portions of the gate electrode.

Another example provides a method of forming a microelectronic device including source and drain regions extending into a semiconductor substrate, the source and drain regions having a first conductivity type and the semiconductor substrate having an opposite second conductivity type. A gate electrode having first and second opposing ends is formed over the semiconductor substrate between the source region and the drain region. A first portion of the gate electrode extends from the first end toward the source region and a second portion of the gate electrode extends from the second end toward the drain region. The first portion of the gate is doped to have the second conductivity type. A dopant of the second conductivity type is implanted into the second portion at the second end of the gate electrode and into the semiconductor substrate adjacent the second end. The gate electrode is thermally annealed such that the dopant of the second conductivity type in the second portion of the gate electrode diffuses toward the first end thereby providing a horizontal gradient of the dopant in the second portion.

DETAILED DESCRIPTION

Figure 1A:
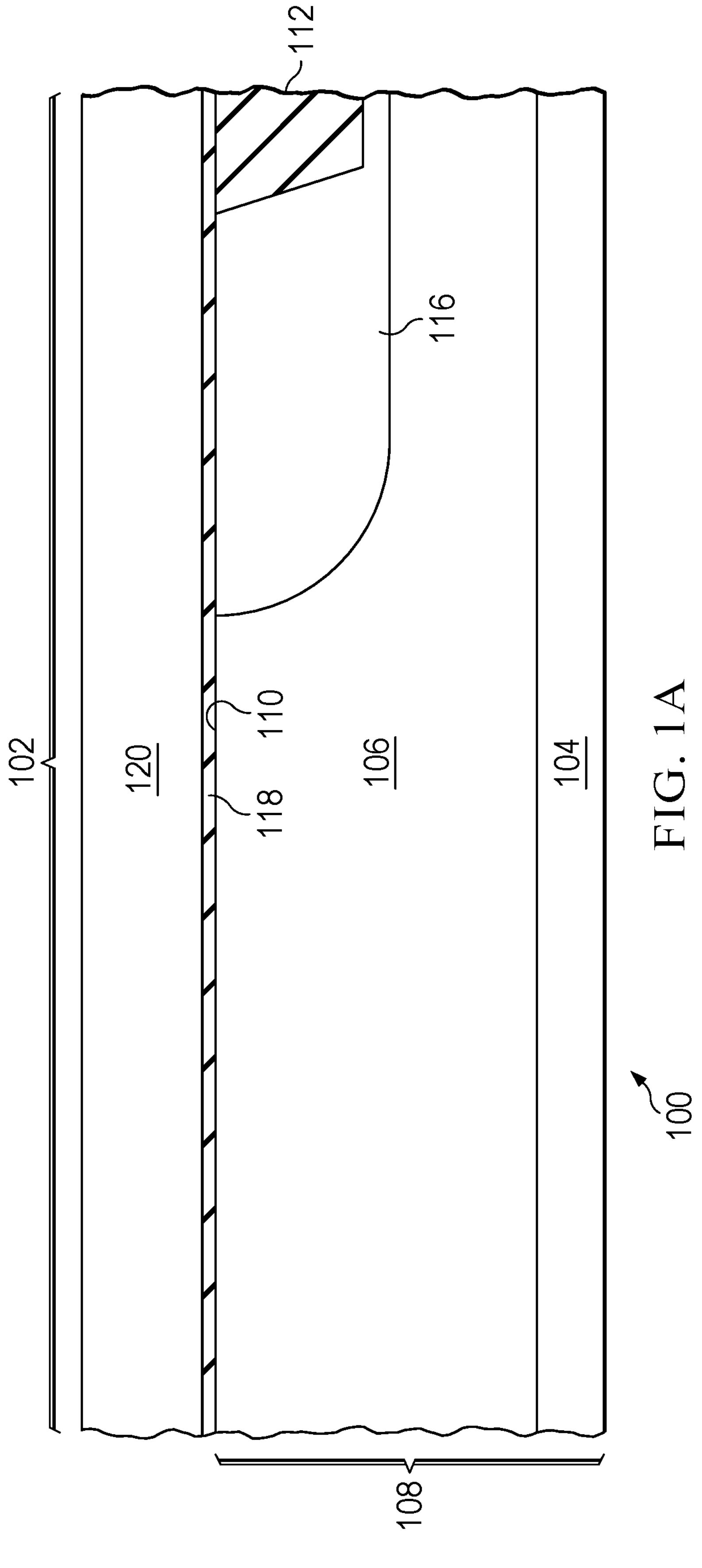
FIG. 1A through FIG. 1G are cross sections of an example microelectronic device including a transistor with a gate electrode formed using an IARC layer, and a depletable resurf gate electrode formed using a self-aligned DWELL implant in various stages of formation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events unless otherwise stated. Furthermore, not all illustrated acts or events are required to implement a methodology in accordance with the present disclosure.

In addition, although some of the examples illustrated herein are shown in two dimensional views with various regions having depth and width, it should be clearly understood that these regions are illustrations of only a portion of a device that is actually a three-dimensional structure.

Accordingly, these regions will have three dimensions, including length, width, and depth, when fabricated on an actual device. Moreover, while the present disclosure may be illustrated by examples directed to active devices, it is not intended that these illustrations be a limitation on the scope or applicability of the present disclosure. It is not intended that the active devices of the present disclosure be limited to the physical structures illustrated. These structures are included to demonstrate the utility and application of the present disclosure to various examples.

It is noted that terms such as top, bottom, over, above, and under may be used in this disclosure. These terms should not be construed as limiting the position or orientation of a structure or element, but should be used to provide spatial relationship between structures or elements. The terms "lateral" and "laterally" refer to directions parallel to a plane corresponding to a surface of a layer, for example a top surface of a semiconductor substrate. Moreover, the term "approximately," as used herein, may refer to ±5% to ±10% variations of the recited values in some cases. In other cases, the term "approximately" may refer to +10% to +20% variations of the recited values.

Microelectronic devices are being continually improved to reliably operate with higher performance and smaller feature sizes. Fabricating such microelectronic devices satisfying area scaling and reliability requirements presents ongoing challenges. Certain gate-controlled devices such as metal-oxide-semiconductor (MOS) transistors include features for supporting high voltage operations, e.g. With a voltage applied to their drain (or drain structure) of about 20 V, 30 V, 40 V, or even greater. Such MOS transistors may include drain diffusion profiles (or drain junction profiles) devised to support the high voltages applied to the drain, e.g. Having an extended portion to distribute the voltage drop across greater distances. Accordingly, such MOS transistors may be referred to as drain-extended MOS transistors, for example drain-extended n-channel MOS (DENMOS) transistors, drain-extended p-channel MOS (DEPMOS) transistors, laterally-diffused MOS (LDMOS) transistors, as well as groups of DENMOS and DEPMOS transistors (which may be referred to as complimentary drain-extended MOS or DECMOS transistors). Other gate controlled microelectronic devices may include a gated bipolar semiconductor device, a gated unipolar semiconductor device, an insulated gate bipolar transistor (IGBT), a MOS-triggered SCR, a MOS-controlled thyristor, and a gated diode.

Baseline field-effect transistors typically have a gate electrode over a channel region, wherein the gate electrode is doped a same conductivity type as the channel region, the channel region in turn being between a source region and a drain region having the same conductivity type. Thus, when the transistor is in an off state, the gate electrode has an opposite majority carrier type than the majority carrier type of the channel region. For example, a baseline n-type transistor, e.g. An n-channel MOSFET, has a p-type body region before channel inversion, and the gate electrode is typically heavily doped for high conductivity. In the case of extended-drain (ED) transistors, the operating voltage may be limited by avalanche breakdown at the drain-to-body junction, the breakdown often occurring at the silicon surface. In contrast, examples of the present disclosure include the innovative recognition that by doping the drain end of the gate electrode with a light doping of the opposite doping type of the majority charge carrier of the channel under inversion (e.g. Electrons for an n-channel device), the gate electrode can be depleted by the electric field produced by the drain at high drain voltages. In this manner, the gate electrode may act as a semiconductor "resurf" element, resurf referring to REduced SURface Field. The gate electrode of the example devices may be referred to as a "depletable resurf gate electrode", as the carriers in the gate electrode are depleting at the same time as the carriers in the drain drift region of the ED device example. The electrons and holes mutually deplete each other due to the electric field from the junction reverse bias. This results in a reduction of the electric field in the gate oxide at the drain end of the gate electrode which reduces aging in the microelectronic device by reducing failure mechanisms such as channel hot carrier (CHC) and gate oxide rupture. In this manner device reliability may be improved and/or device size may be reduced.

By way of further background, the gate electrode of an operating ED transistor performs the important function of controlling the silicon surface potential in the channel region. The bottom of the portion of the gate electrode overlying the channel should enforce a metallic boundary condition during gate switching in order to control the surface potential of the underlying channel silicon, forcing the silicon surface carrier profile into accumulation (transistor gate off-state), through depletion (sub-threshold), and eventually to strong inversion (on-state), as the gate electrode is changed from 0 V to a positive on-state voltage (NMOS transistor) or a negative on-state voltage (PMOS transistor).

In order to achieve this channel surface potential control, the portion of a semiconducting gate electrode whose lower surface lies over the channel must have a high dopant concentration, since maintaining a metallic boundary condition requires that the vertical electric field in the gate dielectric be screened by free carriers to result in a zero electric field within the conductive interior of this portion of the gate electrode. Obtaining a sufficiently high concentration of free carriers requires a high concentration of majority carrier doping in the portion of the gate electrode that lies over the channel. In some examples it is desirable that the dopant concentration in the channel be at least high enough that the carrier profile is degenerate, or at least $1\times10^{19}$ $cm^{-3}$.

At the drain end of the gate electrode, the doping profile of the drain region underlaps the gate electrode. In the transistor gate off-state, and particularly when the drain region is held at a high reverse bias (commonly referred to as the blocking state), the majority carriers in this drain underlap portion of the gate electrode will deplete, exposing ionized majority carrier dopants. If the doping type of the gate electrode overlying the drain region is the same as that of the drain, then majority carriers will be attracted to the bottom of the gate electrode near and including its drain end and will form an accumulation layer that provides a metallic boundary condition. This causes a high local high electric field in the gate dielectric near the drain end and, at the bottom drain-facing corner of the gate electrode, the electric field may be intensified by the curvature of the gate electrode corner. This localized peak in electric field may be high enough to cause transistor degradation mechanisms such as CHC injection or dielectric failure in the gate dielectric, which can pose severe restrictions on transistor usage at elevated drain blocking voltages.

Examples consistent with the disclosure provide doping in the drain end of the gate that has a conductivity type, e.g. P-type, opposite the conductivity type of the doping of the drain, e.g. N-type. In this configuration the majority carriers in the drain end of the gate electrode may deplete under the action the electric field caused by the drain in a reverse bias state. Furthermore, in various examples the majority carrier concentration in the drain end of the gate electrode may be low enough to deplete without undergoing breakdown, as is ensured by the resurf condition of having a dopant dose below $1\times10^{13}$ $cm^{-2}$. A significant portion of the gate (for example even wider than the gate electrode thickness) can be depleted during drain reverse bias, turning this portion of the gate electrode into a charged dielectric region that counter-balances the exposed charges in the underlying silicon due to the opposite doping sign. This charge balance alleviates the highest surface electric field peaks across the overlap region between the drain doping profile and the gate electrode, enabling drain extended transistor operation at high blocking drain voltages without incurring the degradation effects of high local electric fields, especially when operating in pulsed mode. This mutual-depletion effect between the drain carrier profile and the carrier profile in the drain-facing end of the gate electrode is similar to the mutual depletion of an n-layer and a p-layer in a resurf drift region, so we refer to a drain extended transistor employing this gate electrode doping profile as a depletable resurf gate electrode drain extended transistor.

The extent of the depletion of the drain-facing end of the gate electrode should be limited so that it does not extend to source-end features such as a silicide on the top surface of the gate electrode, to avoid breakdown effects such as avalanching. To suppress such an effect, in some examples the doping concentration of the gate electrode increases as it approaches any surface silicide or other feature that could cause breakdown.

The disclosure includes several examples of implants which are self-aligned to the source end of the gate electrode. A self-aligned DWELL implant provides an advantageous method to simultaneously implant a dopant of the first type (the same type as the channel region before inversion) into the gate electrode which forms a third portion of the gate electrode over the channel region, implant a dopant of the second type (the opposite type as the channel region before inversion) in the gate electrode which forms a second portion of the gate electrode over a drift region, and implant dopants of the first type and second type in the silicon near the source side of the gate electrode which forms a DWELL that provides the channel region and a body region. Additionally, the self-aligned DWELL implant provides an advantageous method to implant dopants of the second type to form the second portion of the gate electrode while simultaneously implanting the silicon near the source side of the gate electrode.

Figure 1B:
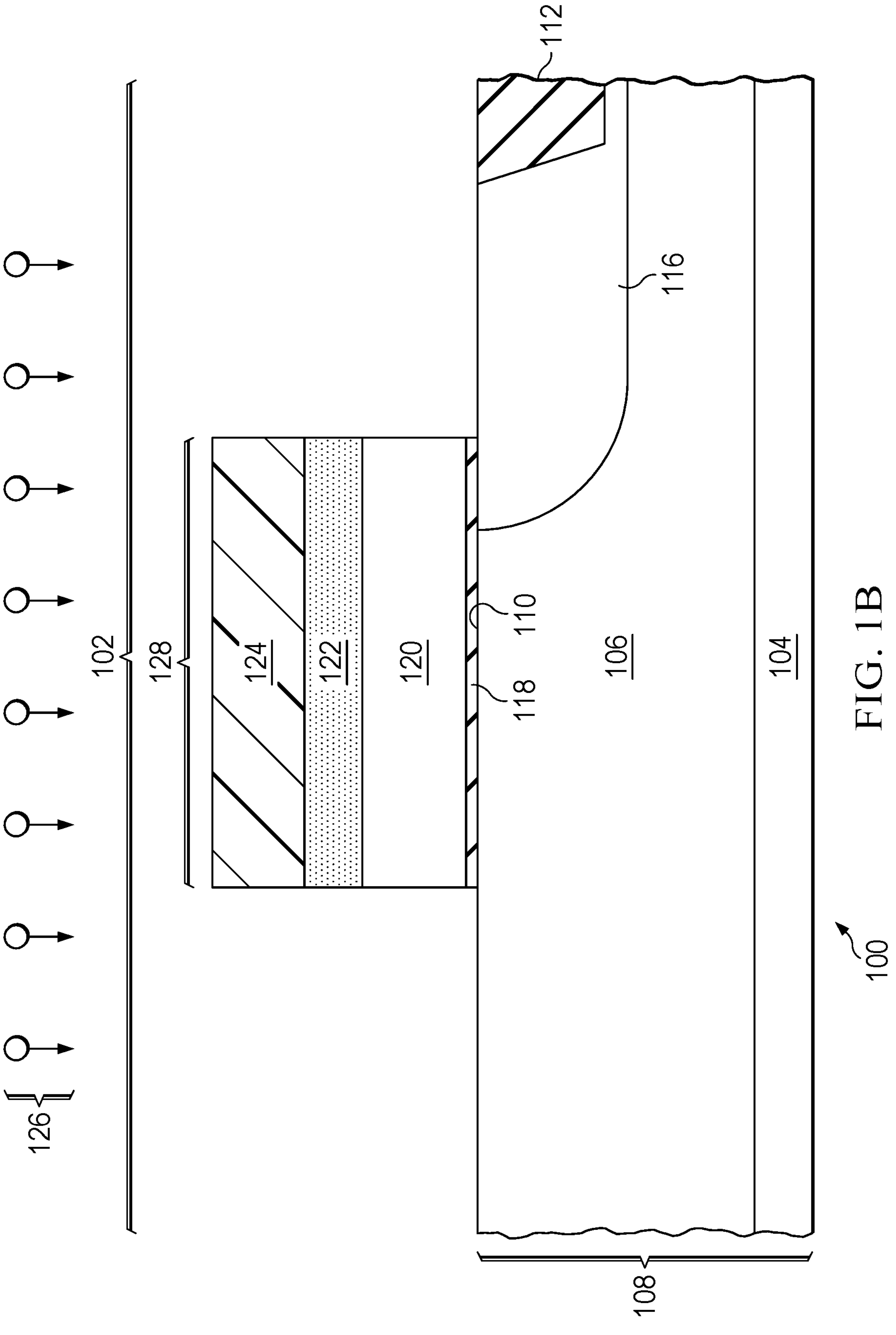

FIG. 1A through FIG. 1G are representative of a first type of microelectronic device 100 to which the principles of the disclosure may be beneficially applied. These figures show cross sections of an example microelectronic device 100, e.g. A MOS transistor, including a depletable resurf gate electrode 128 (FIG. 1B, et seq.) Herein referred to as the gate electrode 128. Without implied limitation, the gate electrode 128 in this example is implemented in a DENMOS transistor 102 which is shown in successive stages of an example method of formation. Other implementations for the gate electrode 128 in a DEPMOS transistor are within the scope of this example. In the example DENMOS transistor 102, dopants of a first conductivity type are n-type dopants and dopants of a second conductivity type are p-type dopants.

FIG. 1A shows the microelectronic device 100 including the DENMOS transistor 102 after the formation of a gate dielectric layer 118 and a gate layer 120. The structures and method within the microelectronic device 100 formed before the gate dielectric layer 118 formation may include an epitaxial layer 106 over a base wafer 104, together referred to as a substrate 108 with a top surface 110. The base wafer 104 may be p-type silicon with a dopant concentration of $1\times10^{17}$ $cm^{-3}$ to $1\times10^{19}$ $cm^{-3}$, for example. Alternatively, the base wafer 104 may be lightly doped, with an average dopant concentration below $1\times10^{16}$ $cm^{-3}$. The epitaxial layer 106 may be p-type silicon with a dopant concentration of $1\times10^{15}$ $cm^{-3}$ to $1\times10^{16}$ $cm^{-3}$, by way of example. The epitaxial layer 106 is optional in that the DENMOS transistor 102 may be formed directly in the base wafer 104 in some examples.

An isolation layer for the DENMOS transistor 102 may be formed either by shallow trench isolation (STI) or local oxidation of silicon (LOCOS), either of which may be conventional or by any future-discovered method. The illustrated example includes STI structures 112.

A drift region 116 is formed in the substrate 108 in the epitaxial layer 106 and under a portion of the gate dielectric layer 118. One or more n-type implants are performed to form the drift region 116 (which may be referred to as an n-drift region) in the substrate 108. The n-type dopant that defines the n-drift region 116 may be implanted in one step or in multiple steps. For example, phosphorus may be implanted at a total dose of between $1\times10^{12}$ $cm^{-2}$ and $1\times10^{13}$ $cm^{-2}$ with energies suitable for forming the n-drift region 116 with or without subsequent thermal cycles. Arsenic may also be implanted with a similar dose with an energy relatively less than the phosphorus implant.

While not limited to the features discussed above in FIG. 1A which are formed in the substrate 108 of the DENMOS transistor 102, the gate dielectric layer 118 and gate layer 120 are formed over the top surface 110. The gate dielectric layer 118 may be formed in a high temperature furnace operation or a rapid thermal process. Other methods of forming the gate dielectric layer 118 are within the scope of this disclosure. The gate dielectric layer 118 may be any material and have any thickness appropriate to the technical application. The gate layer 120 is formed on the gate dielectric layer 118 by a conventional or future-discovered method. In the illustrated example, the gate layer 120 is formed by a deposition process using one or more silane-based precursors to deposit polycrystalline silicon (which may be referred to as polysilicon). In other examples, a replacement gate process may be used to form the gate layer 120. The gate layer 120 has a thickness that may range from approximately 50 nm to 300 nm. The gate layer 120 may be undoped or in situ doped as-deposited. In this example formation, the gate layer 120 is co-deposited with a p-type precursor such as (diborane, boron trichloride, Tris(2,4 pentanedionato)gallium(III) such that the p-type dopant dose (e.g. The integral of net p-type doping concentration through the thickness of the gate electrode) is between $1\times10^{12}$ $cm^{-2}$ and $1\times10^{13}$ $cm^{-2}$. The low doping concentration in the gate layer 120 provides a resurf region to be defined at a later stage of processing. The gate layer 120 may also be a poly-SiGe layer, a poly-Ge layer, a poly-SiC layer, or another semiconductor that can be grown or deposited on a gate dielectric.

FIG. 1B shows a cross section of the DENMOS transistor 102 after an inorganic anti-reflective coating (IARC) 122 and a gate resist 124 have been formed, and after a gate plasma etch 126. The gate plasma etch 126 removes previously formed gate dielectric layer 118, the gate layer 120, and IARC 122 in areas not covered by the gate resist 124. The area under the gate resist 124 defines a gate electrode 128 and gate dielectric layer 118, the gate electrode 128 including the portion of the gate layer 120 remaining after the gate plasma etch 126. After the gate plasma etch 126 is complete, the gate resist 124 is removed and a wet or dry process may be used to clean the wafer surface.

Figure 1C:
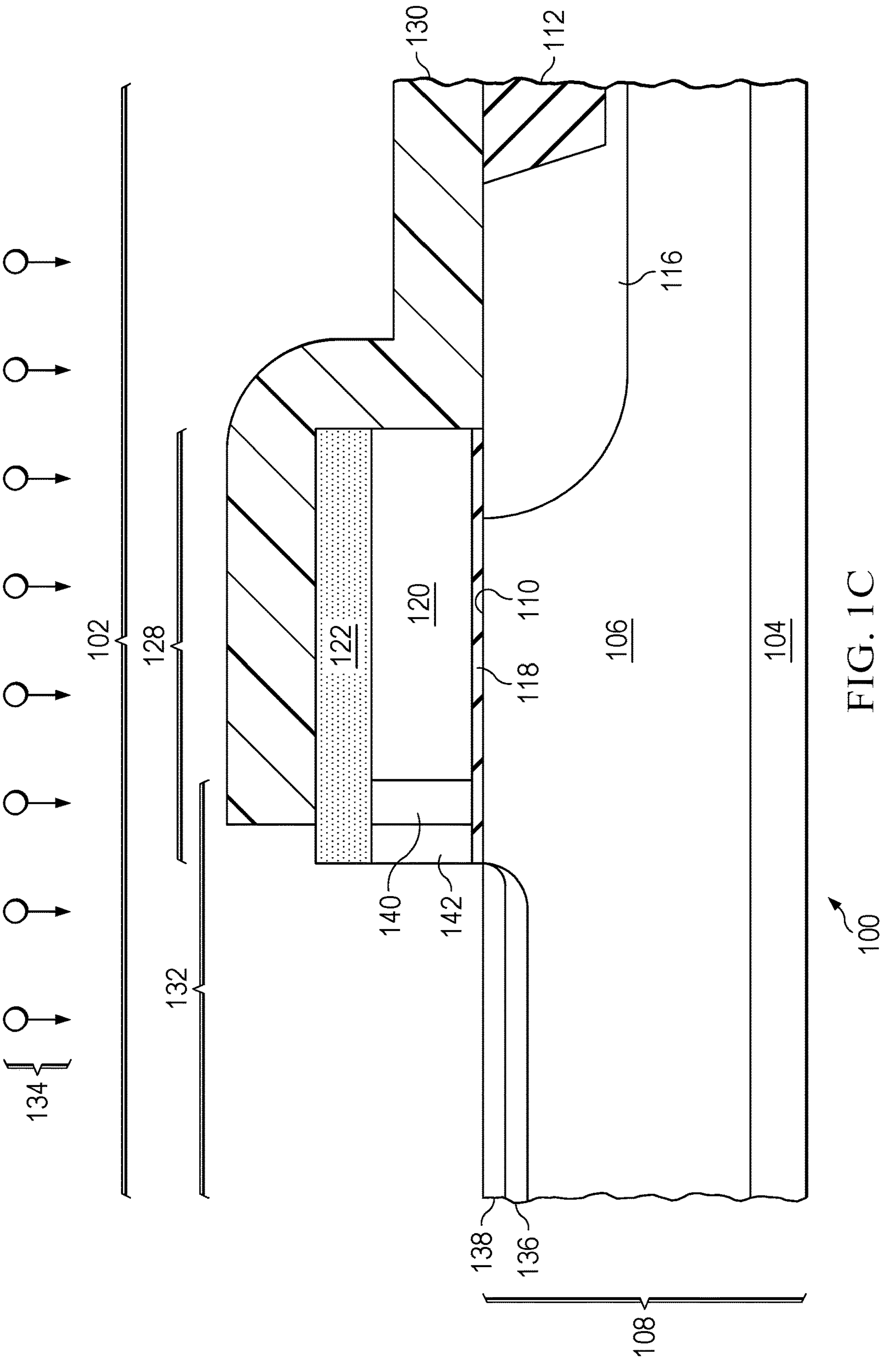

Referring to FIG. 1C, a DWELL resist 130 is formed. A self-aligned DWELL implant 134 may implant p-type and n-type ions through a DWELL resist opening 132 to form several implanted regions of the DENMOS transistor 102. The IARC 122 is coincident with the vertical edges of the gate electrode 128. The presence of an IARC 122 on the gate electrode 128 may be advantageous as this may result in improved implant uniformity in the gate electrode 128 during the self-aligned DWELL implant 134. The self-aligned DWELL implant 134 may consist of one or more p-type implants and one or more n-type implants. Some of the n-type implants and p-type implants may be angled up to 45 degrees to implant n-type ions and p-type ions into the vertical surface of the gate electrode 128. The p-type well region 136 and p-type gate region 140 are implanted with p-type dopants which may include boron and/or indium. The p-type well region 136 may have a peak dopant density up to $1\times10^{19}$ $cm^{-3}$ or greater at a depth between 0.2 μm and 0.6 μm below the top surface 110 after a thermal anneal. The p-type gate region 140 may have a peak dopant density between $3\times10^{16}$ $cm^{-3}$ and $1\times10^{19}$ $cm^{-3}$. The p-type well region 136 (in conjunction with the epitaxial layer 106 in some examples) may be referred to as a body region (e.g., P-type body region) of the DENMOS transistor 102. The p-type gate region 140 forms a second portion 146 (referred to in FIG. 1D) of the gate electrode 128 after a thermal anneal.

Additionally, in the substrate 108, the self-aligned DWELL implant 134 forms a n-type well region 138. The n-type well region 138 is doped with n-type dopants which may include phosphorus or arsenic by way of example. The n-type well region 138 may have a peak dopant density up to $1\times10^{19}$ $cm^{-3}$ or greater at a depth between 0.05 μm and 0.3 μm below the top surface 110 after a thermal anneal. The self-aligned DWELL implant 134 also implants n-type ions to form a n-type gate region 142. The n-type gate region 142 may have a peak dopant density between $3\times10^{16}$ $cm^{-3}$ and $1\times10^{19}$ $cm^{-3}$. After the self-aligned DWELL implant 134, the DWELL resist 130 and the IARC 122 are removed.

Figure 1D:
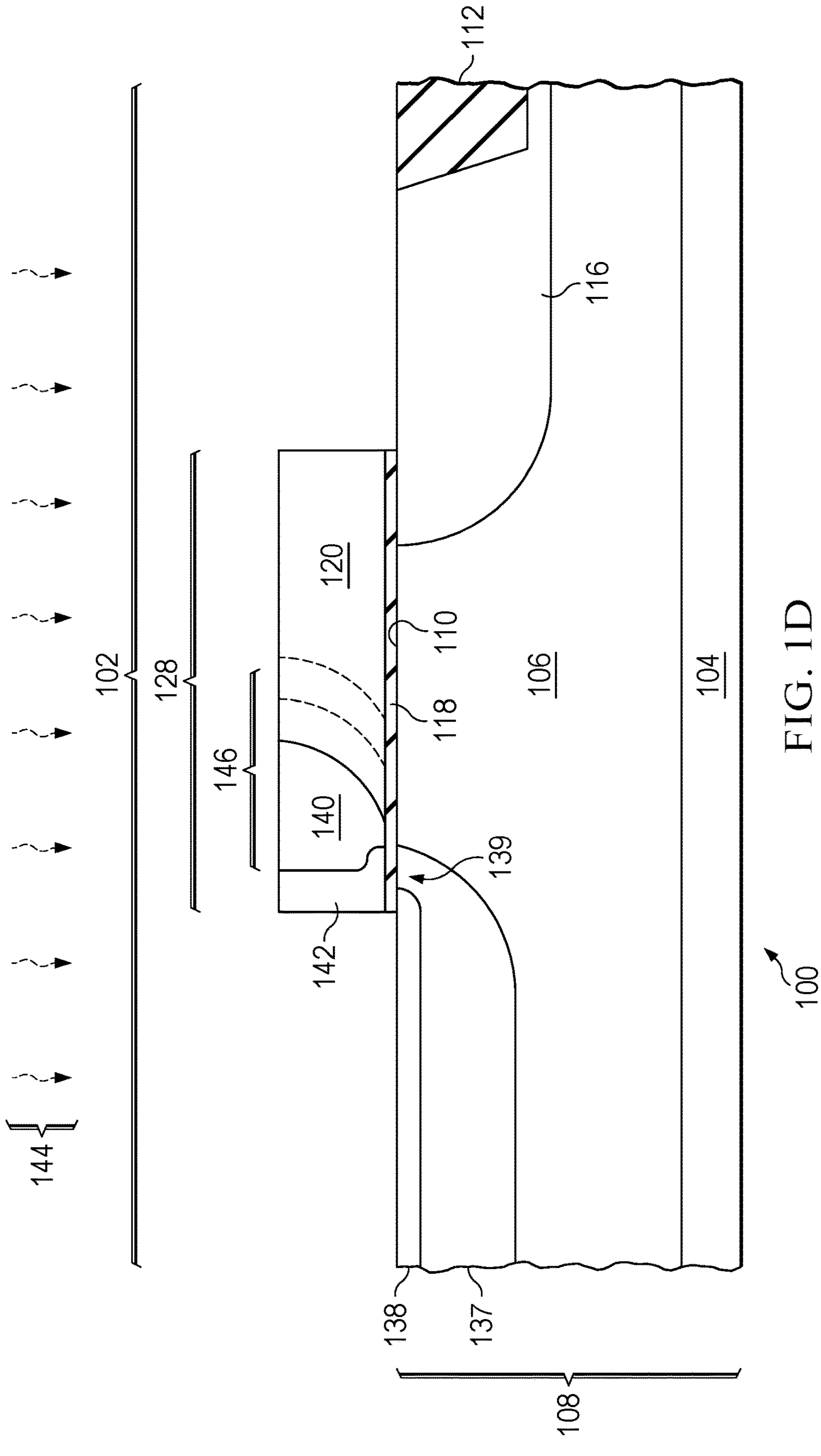

Referring to FIG. 1D, a thermal anneal step 144 may be used to activate and diffuse the implanted species from the self-aligned DWELL implant 134 thereby forming a DWELL 137. The DWELL 137 extends to the top surface 110 between the n-type well region 138 and the n-type drift region 116. A furnace or rapid thermal anneal (RTA) process may be used as the heat source for the thermal anneal step 144. In the substrate 108, the thermal anneal provides the thermal budget for the p-type boron of the self-aligned DWELL implant 134 to diffuse past the n-type well region 138 of the self-aligned DWELL implant 134 forming the channel profile of a channel region 139 in the lateral direction. In the gate electrode 128, the thermal anneal step 144 takes advantage of the higher diffusion constant of p-type boron in the p-type gate region 140 compared to n-type arsenic in the n-type gate region 142 allowing separation of the implanted species in the gate electrode 128 after thermal treatment into a second portion 146 which is heavily p-type doped, and the n-type gate region 142 which is herein referred to as the third portion 142 which is heavily n-type doped.

In the remaining discussion of FIG. 1D, the portions of the gate electrode 128 noted as 120, 146 and 142 in FIG. 1D may respectively be referred to as first portion 120, second portion 146 and third portion 142. In the first portion 120 of the gate electrode 128 (the resurf region) the p-type doping density is low enough to allow depletion during operation of the DENMOS transistor 102 and allow it to function as a resurf region. The second portion 146 of the gate electrode 128 is heavily p-type doped in the p-type gate region 140 (greater than $1\times10^{18}$ $cm^{-3}$) with a horizontal gradient to lighter doping until it is equivalent to the doping of the first portion 120 at the interface between the second portion 146 and the first portion 120. The heavily doped p-type doped gate region 140 of the second portion 146 of the gate electrode between the third portion 142, which is heavily n-type doped (greater than $1\times10^{18}$ $cm^{-3}$), and the first portion 120, which is lightly p-type doped, of the gate electrode 128 prevents n-type dopants of the third portion 142 from counter doping the p-type dopants of the first portion 120. While the overall doping of the third portion 142 is heavy, it may also have a horizontal gradient of doping with the heaviest doping at the source end of the gate electrode 128 and lighter doping at the interface between the third portion 142 and the second portion 146.

Figure 1E:
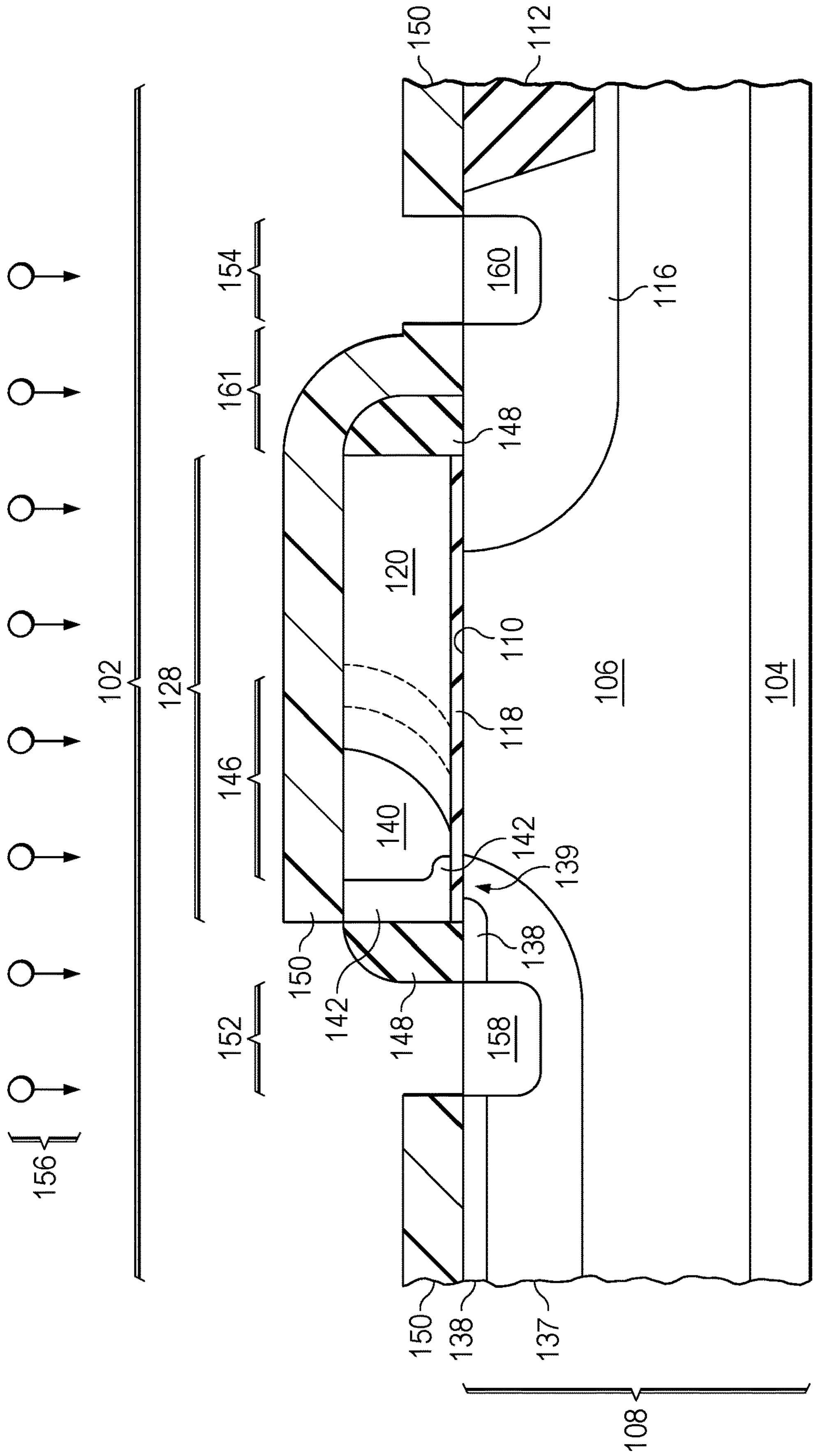

Referring to FIG. 1E, sidewall spacers 148 may be formed on the vertical surfaces of the gate electrode 128, and may extend 50 nm to 200 nm from the lateral edge of the gate electrode 128. After the formation of the sidewall spacers 148, a first source/drain resist 150 is deposited and patterned. A first source/drain implant 156 implants n-type dopants through a source opening 152 and a drain opening 154 into the substrate 108 to implant a source region 158 and a drain region 160. The first source/drain implant 156 may include one or more implant steps, with conditions such that resulting the source region 158 and the drain region 160, have a dopant concentration peaking between $1\times10^{19}$ $cm^{-3}$ and $1\times10^{21}$ $cm^{-3}$. The source region 158 and drain region 160 contain an average dopant density at least twice that of the epitaxial layer 106 with the peak doping density between 0.15 μm and 0.5 μm from the top surface 110. A source/drain resist extension 161 extends the first source/drain resist 150 past the end of the gate electrode 128 towards the drain region 160. The source/drain resist extension 161 prevents n-type dopants from the first source/drain implant 156 from extending under the gate electrode 128 after subsequent thermal annealing processes. After the formation of the source region 158 and the drain region 160, the first source/drain resist 150 is removed and the wafer is thermally annealed (not specifically shown).

Figure 1F:
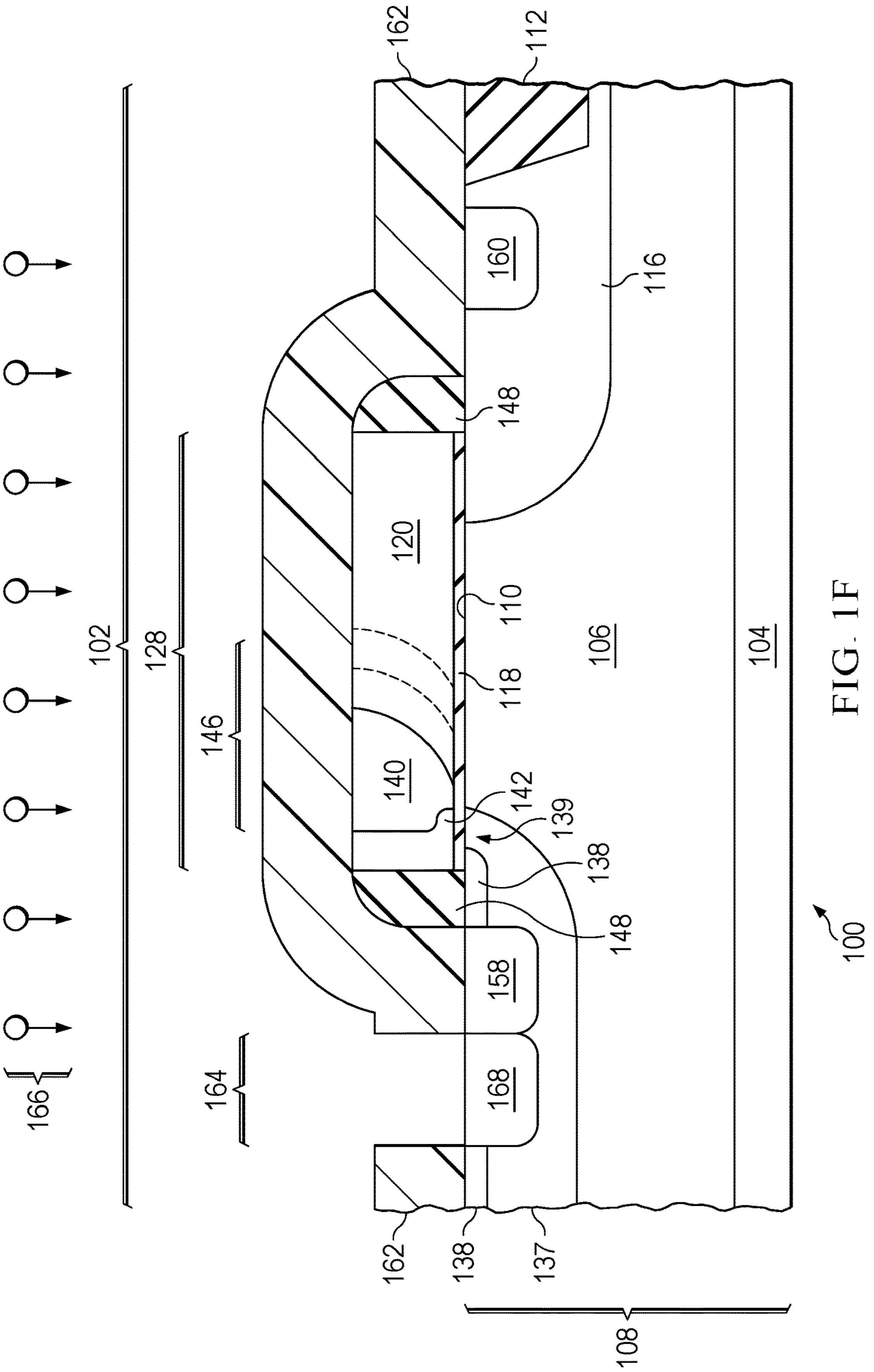

FIG. 1F refers to a cross section of the DENMOS transistor 102 after a second source/drain implant resist 162 is deposited and patterned to a form a second source/drain resist opening 164 for a second source/drain implant 166. The second source/drain implant 166 may implant dopants for a second source/drain region for p-channel devices (not specifically shown) of the microelectronic device 100. Additionally, the second source/drain implant 166 implants p-type dopants through the second source/drain resist opening 164 to form the back gate region 168 of the DENMOS transistor 102.

As with the first source/drain implant 156, the second source/drain implant 166 may occur in one or more steps. The second source/drain implant 166 may implant species including boron (or indium) with an overall dose and energy such that they provide degenerate doping, e.g., Having an active average dopant density greater than $1\times10^{19}$ $cm^{-3}$ near the solubility limit of the dopant atoms in back gate region 168. After the second source/drain implant 166, the second source/drain implant resist 162 is removed.

Figure 1G:
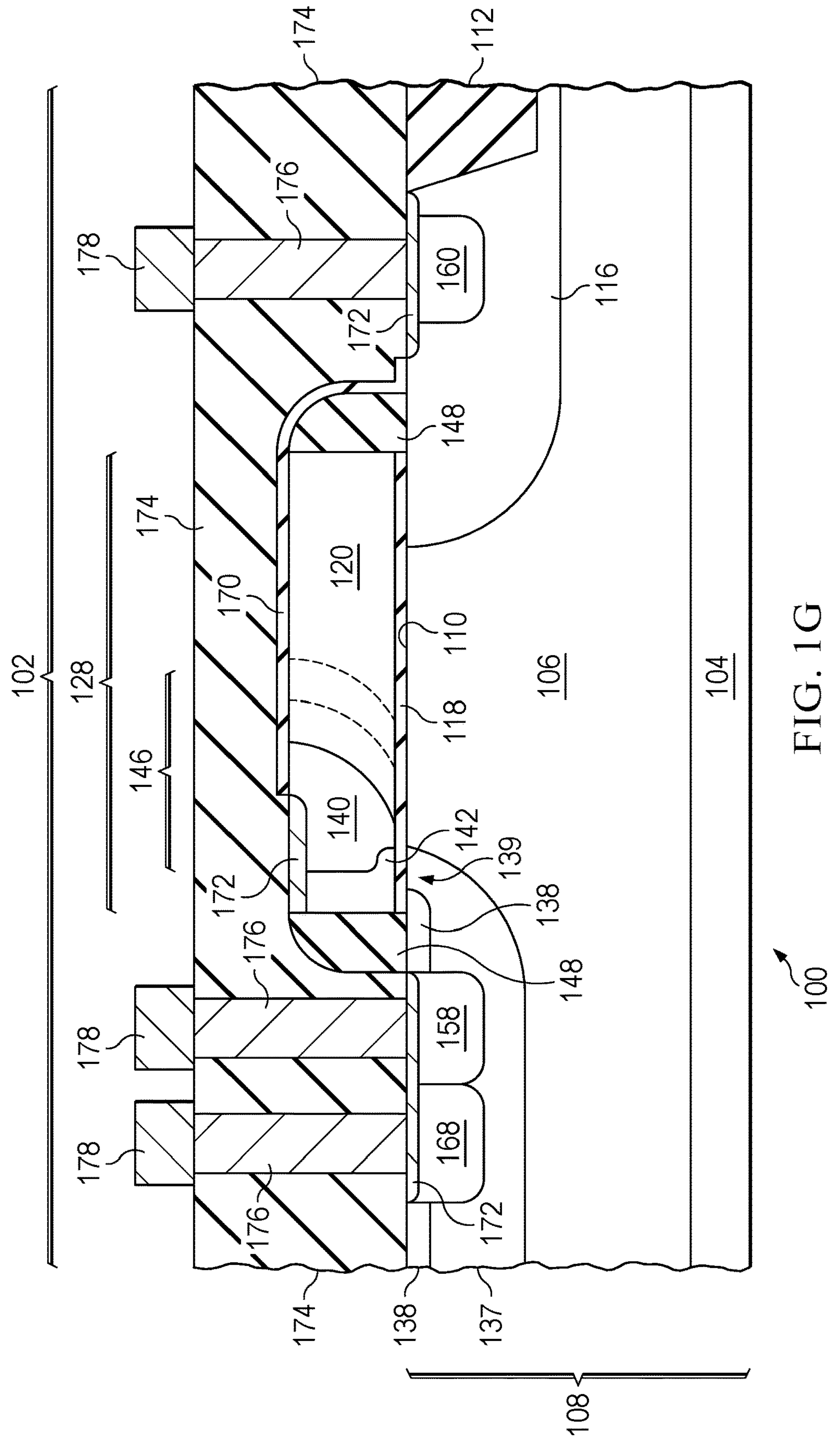

FIG. 1G shows a cross section of the DENMOS transistor 102 after a first level of interconnects 178 is complete. In some examples a silicide blocking layer 170 may be formed over the first portion 120 of the gate electrode 128, extending partially over the second portion 146 of the gate electrode 128, and leaving an area of the second portion 146 and the third portion 142 uncovered by the silicide blocking layer 170. The silicide blocking layer 170 may be formed by depositing one or more sublayers of an oxide, a nitride, an oxynitride, or any combination thereof over the entire wafer and patterning to open areas in which silicide formation is desired. In some examples, a metal silicide layer 172 may be formed on the source region 158, the drain region 160, the back gate region 168 and exposed portions of the gate electrode 128. The metal silicide layer 172 may provide ohmic electrical connections to the source region 158, the drain region 160, the back gate region 168 and the gate electrode 128 with lower resistances compared to a similar microelectronic device without metal silicide layer 172.

A pre-metal dielectric (PMD) layer 174 is formed over the top surface 110 of the substrate 108. The PMD layer 174 may include one or more dielectric layers, such as silicon nitride, silicon oxynitride, silicon dioxide, or the like. In some examples, the PMD layer 174 includes a PMD liner and a main dielectric sublayer formed on the PMD liner. Subsequently, the PMD layer 174 may be planarized by a chemical mechanical polish (CMP) process. Contacts 176, e.g. Tungsten plugs, are formed within the PMD layer 174 to provide electric connection to the source region 158 and the drain region 160. Interconnects 178 electrically connected to the contacts 176 are formed over the PMD layer 174 using any suitable metallization scheme and provide electrical contact between the DENMOS transistor 102 and other components of the microelectronic device 100.

Figure 2A:
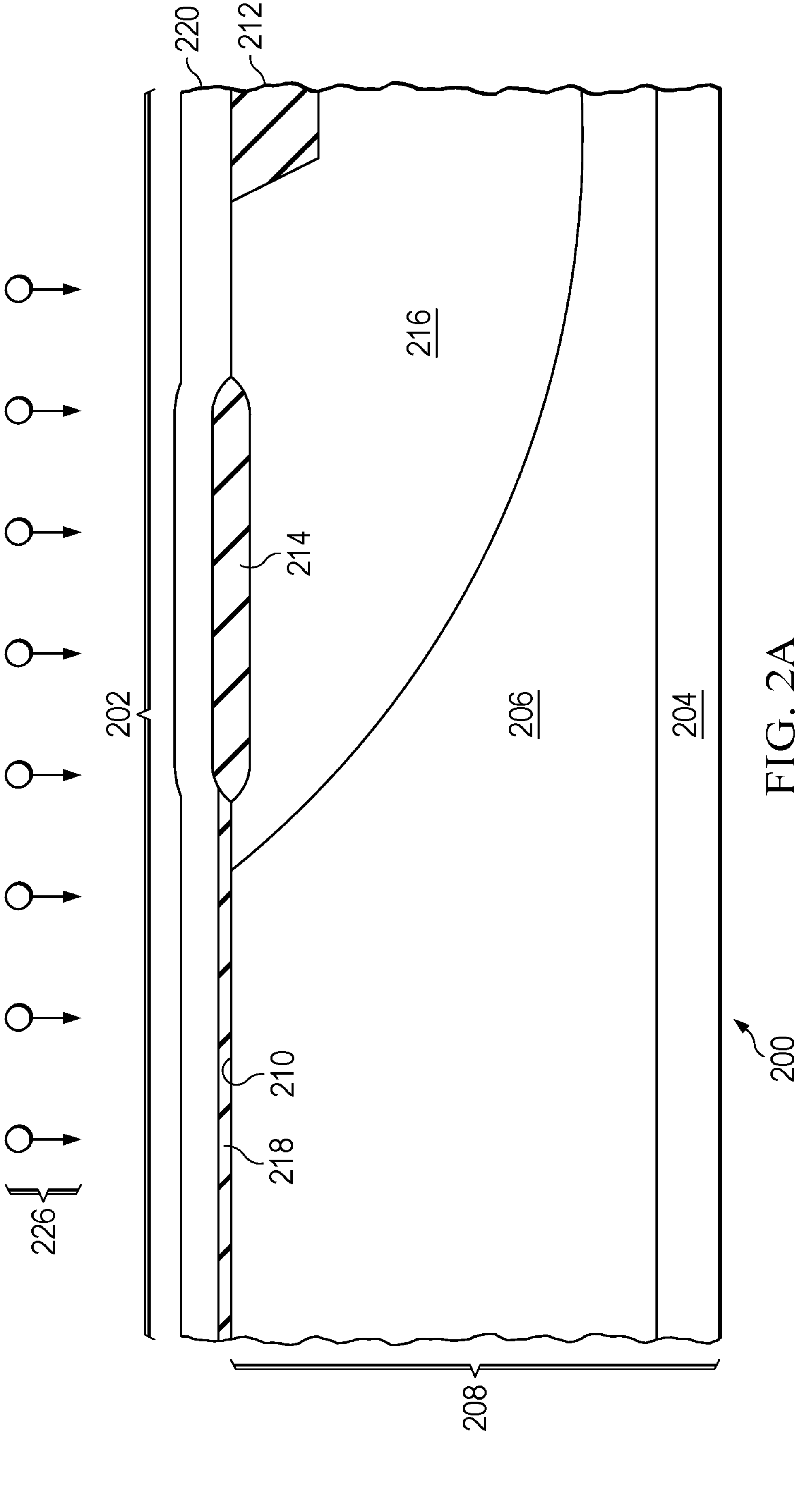
FIG. 2A through FIG. 2H are cross sections of an example microelectronic device including a transistor and a depletable resurf gate electrode formed using a self-aligned DWELL implant in various stages of formation.
Figure 2B:
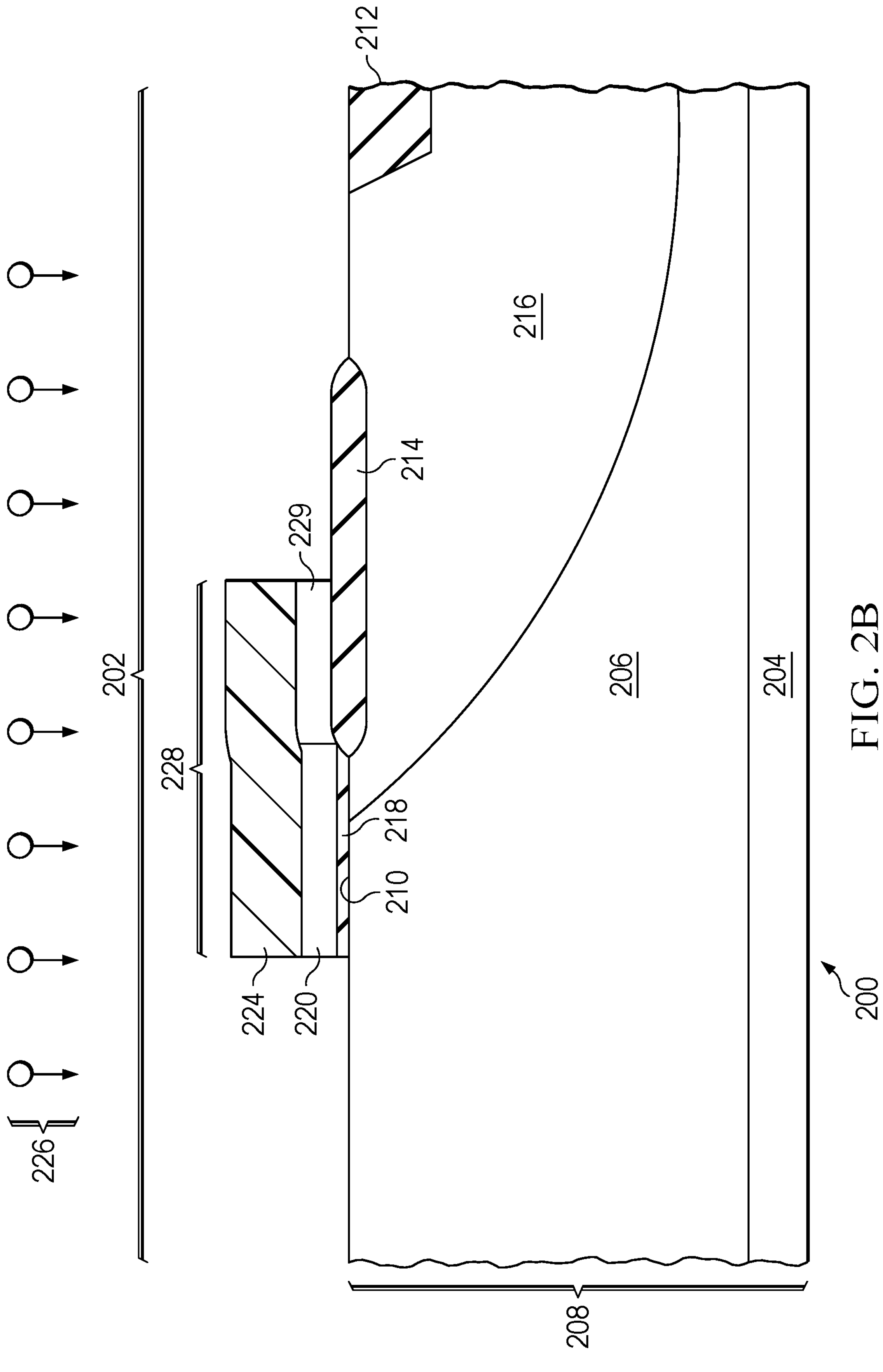

FIG. 2A through FIG. 2H are representative of a second type of electronic device to which the principles of the disclosure may be beneficially applied. These figures show cross sections of an example microelectronic device 200, e.g. A MOS transistor, including a depletable resurf gate electrode 228 (FIG. 2B, et seq.) Herein referred to as the gate electrode 228. Without implied limitation, the gate electrode 228 in this example is implemented in a DENMOS transistor 202 which is shown in successive stages of an example method of formation. Other implementations for the gate electrode 228 in a PMOS transistor are within the scope of this example. In the example DENMOS transistor 202, dopants of a first conductivity type are n-type dopants and dopants of a second conductivity type are p-type dopants.

FIG. 2A shows the microelectronic device 200 including the DENMOS transistor 202 after the formation of a gate dielectric layer 218 and a gate layer 220. The structures and method within the microelectronic device 200 formed before the gate dielectric layer 218 formation may include an epitaxial layer 206 over a base wafer 204, together referred to as a substrate 208 with a top surface 210. The base wafer 204 may be p-type silicon with a dopant concentration of $1\times10^{17}$ $cm^{-3}$ to $1\times10^{19}$ $cm^{-3}$, for example. Alternatively, the base wafer 204 may be lightly doped, with an average dopant concentration below $1\times10^{16}$ $cm^{-3}$. The epitaxial layer 206 may be p-type silicon with a dopant concentration of $1\times10^{15}$ $cm^{-3}$ to $1\times10^{16}$ $cm^{-3}$, by way of example. The epitaxial layer 206 is optional in that the DENMOS transistor 202 may be formed directly in the base wafer 204 in some examples.

An isolation layer for the DENMOS transistor may be formed by either by STI or LOCOS, either of which may be conventional or by any future-discovered method. The illustrated example includes STI structures 212.

A field relief dielectric layer 214 may be formed by a LOCOS process, and may have a thickness in a range between 50 nm and 500 nm. The field relief dielectric layer 214 may have a tapered edge along their perimeter where the field relief dielectric layer 214 adjoins the top surface 210 of the substrate 208. The tapered edge of the field relief dielectric layer 214 may be referred to as a "bird's beak" region. Although the example DENMOS transistor 202 illustrated in FIGS. 2A-2H includes the STI structure 212 and the field relief dielectric layer 214, either feature may be omitted in other examples within the scope of the disclosure. For example, the field relief dielectric layer 214 may be replaced with another STI structure. Similarly, the STI structure 212 may be replaced with another LOCOS structure, e.g. Similar to the field relief dielectric layer 214.

A drift region 216 is formed in the substrate 208 in the epitaxial layer 106 and under a portion of the gate dielectric layer 218. One or more n-type implants are performed to form the drift region 216 (which may be referred to as an n-drift region) in the substrate 208. The n-type dopant that defines the n-drift region 216 may be implanted in one step or in multiple steps. For example, phosphorus may be implanted at a total dose of between $1\times10^{12}$ $cm^{-2}$ and $1\times10^{13}$ $cm^{-2}$ with energies suitable for forming the n-drift region 216 with or without subsequent thermal cycles. Arsenic may also be implanted with a similar dose with an energy relatively less than the phosphorus implant.

While not limited to the features discussed above in FIG. 2A which are formed in the substrate 208 of the DENMOS transistor 202, the gate dielectric layer 218 and gate layer 220 are formed over the top surface 210. The gate dielectric layer 218 may be formed in a high temperature furnace operation or a rapid thermal process. Other methods of forming the gate dielectric layer 218 are within the scope of this disclosure. The gate dielectric layer 218 may be any material and have any thickness appropriate to the technical application. The gate layer 220 is formed on the gate dielectric layer 218 by a conventional or future-discovered method. In the illustrated example, the gate layer 220 is formed by a deposition process using one or more silane-based precursors to deposit polycrystalline silicon (which may be referred to as polysilicon). In other examples, a replacement gate process may be used to form the gate layer 220. The gate layer 220 has a thickness that may range from approximately 50 nm to 300 nm. The gate layer 220 may be undoped or in situ doped as-deposited. In the example shown in FIG. 2A, the gate layer 220 is undoped. (FIG. 1A refers to an example in which the polysilicon is doped as deposited). The gate layer 220 may also be a poly-SiGe layer, a poly-Ge layer, a poly-SiC layer, or another semiconductor that can be grown or deposited on a gate dielectric.

FIG. 2B shows a cross section of the DENMOS transistor 202 after a gate resist 224 has been formed and after a gate plasma etch 226. The gate plasma etch 226 removes previously formed gate dielectric layer 218, and the gate layer 220, in areas not covered by the gate resist 224. The area under the gate resist 224 defines a gate electrode 228, a field plate 229, and a portion of the gate dielectric layer 218 remaining after the gate plasma etch 226. After the gate plasma etch 226 is complete, the gate resist 224 is removed and a wet or dry process may be used to clean the wafer surface.

Figure 2C:
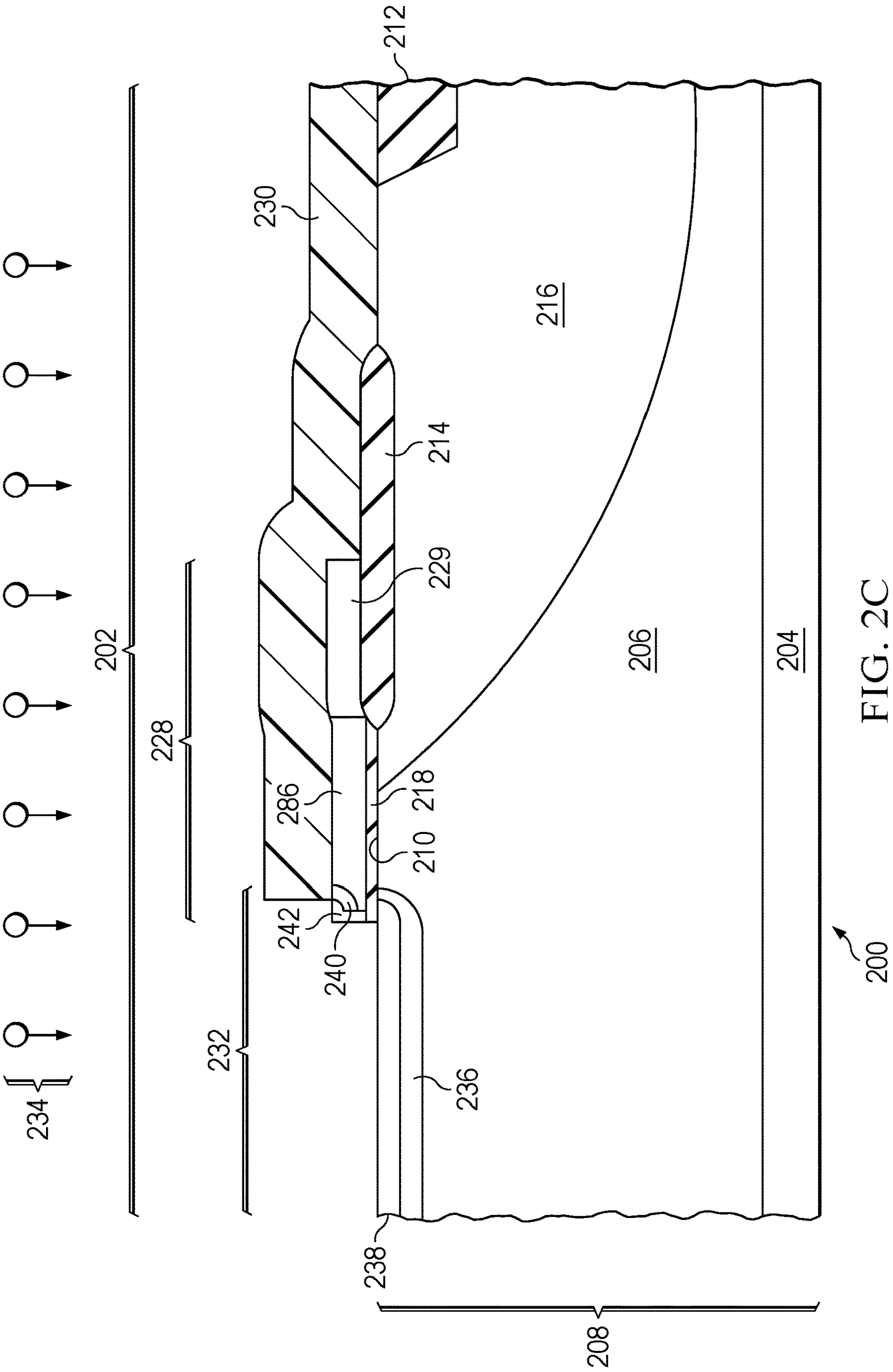

Referring to FIG. 2C, a DWELL resist 230 is formed. A self-aligned DWELL implant 234 may implant p-type and n-type ions through a DWELL resist opening 232 to form several implanted regions of the DENMOS transistor 202. The self-aligned DWELL implant 234 may include one or more p-type implants and one or more n-type implants.

Some of the n-type implants and p-type implants may be angled up to 45 degrees to implant n-type ions and/or p-type ions into the vertical surface of the gate electrode 228. The p-type well region 236 and p-type gate region 240 are implanted with p-type dopants which may include boron and/or indium. The p-type well region 236 may have a peak dopant density of $1\times10^{19}$ $cm^{-3}$ or greater at a depth between 0.2 μm and 0.6 μm below the top surface 210 after a thermal anneal. The p-type gate region 240 may have a peak dopant density between of $1\times10^{19}$ $cm^{-3}$ or greater. The p-type well region 236 (in conjunction with the epitaxial layer 206 in some examples) may be referred to as a body region (e.g., P-type body region) of the DENMOS transistor 202. The p-type gate region 240 forms the second portion 246 (referred to in FIG. 1D) of the gate electrode 228 after a thermal anneal.

Additionally, in the substrate 208, the self-aligned DWELL implant 234 forms a n-type well region 238. The n-type well region 238 is doped with n-type dopants which may include phosphorus or arsenic by way of example. The n-type well region 238 may have a peak dopant density of $1\times10^{19}$ $cm^{-3}$ or greater at a depth between 0.05 μm and 0.3 μm below the top surface 210. The self-aligned DWELL implant 234 also implants n-type ions to form a n-type gate region 242. The n-type gate region 242 may have a peak dopant density of between $1\times10^{19}$ $cm^{-3}$ or greater. The n-type gate region 242 may herein be referred to as the third portion 242 of the gate electrode. After the self-aligned DWELL implant 234, the DWELL resist 230 is removed.

Figure 2D:
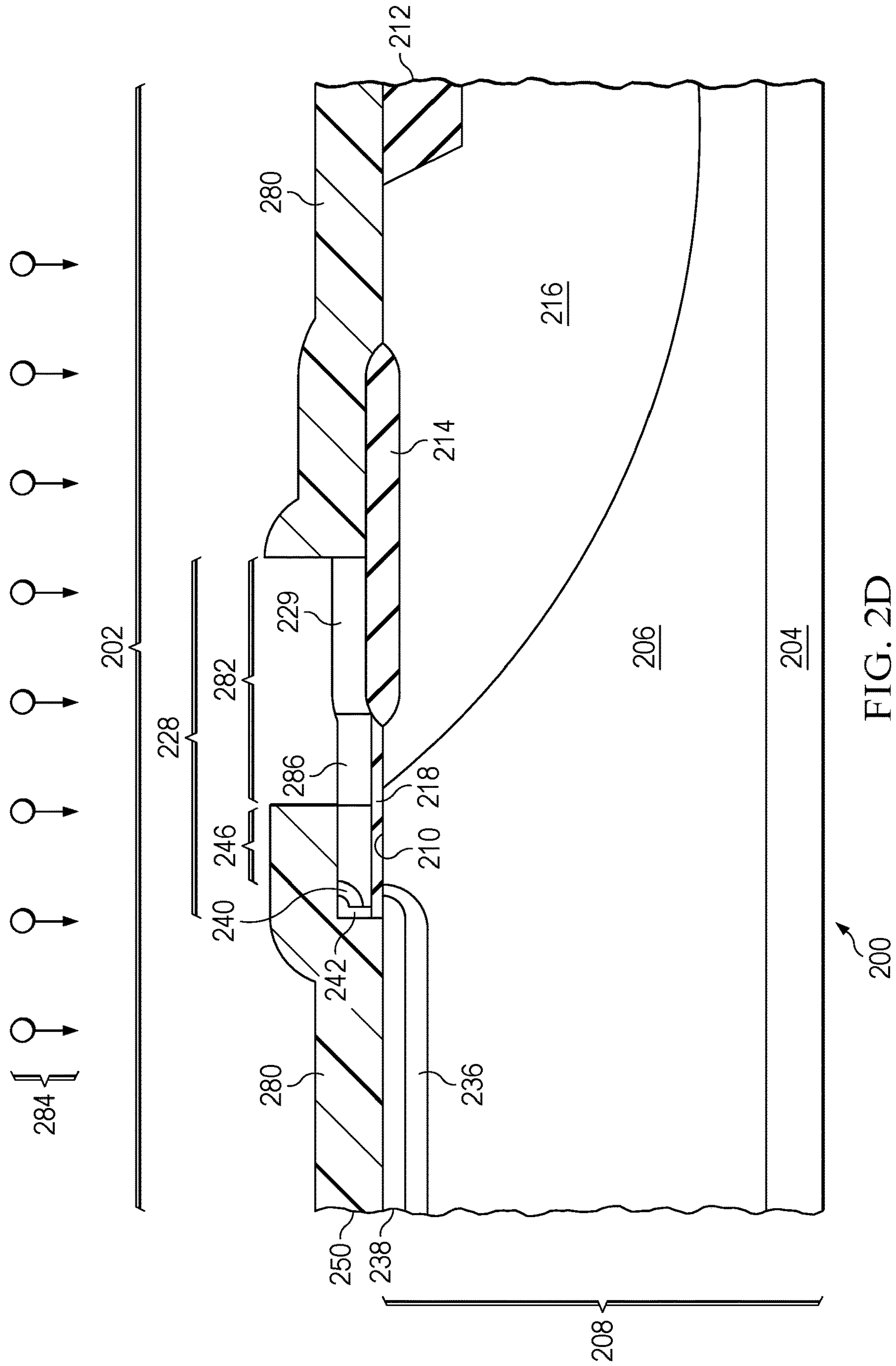

FIG. 2D shows a cross section after a resurf resist 280 is deposited and patterned with a resurf resist opening 282. A resurf implant 284 uses ion-implantation to implant p-type dopants to form a first portion 286 of the gate electrode 228. The resurf implant 284 may occur in one or more steps with implant species including one or more of boron or indium with an overall dose of between $1\times10^{12}$ $cm^{-2}$ and $1\times10^{13}$ $cm^{-2}$. After the resurf implant 284, the resurf resist 280 is removed.

Figure 2E:
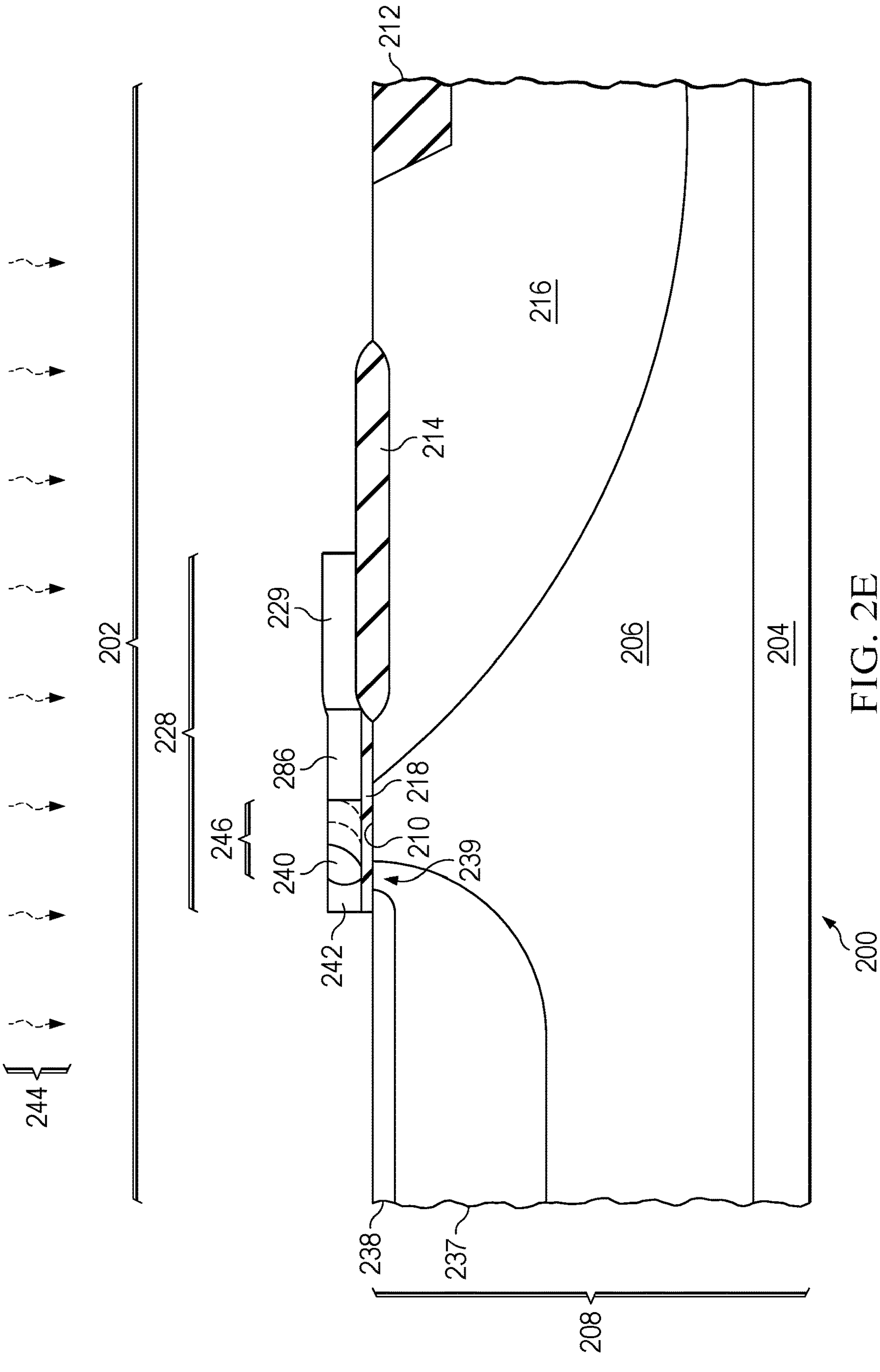

Referring to FIG. 2E, a thermal anneal step 244 may be used to activate the implanted and diffuse species from the self-aligned DWELL implant 234 thereby forming DWELL 237. The DWELL 237 extends to the top surface 210 between the n-type well region 238 and the drift region 216 thereby providing a channel region 239 of the microelectronic device 200. A furnace or RTA process may be used as the heat source for the thermal anneal step 244. In the substrate 208, the thermal anneal provides the thermal budget for the dopants of the p-type well region 236 to diffuse past the n-type well region 238 to form the channel profile in the lateral direction. In the gate electrode 228, the thermal anneal step 244 takes advantage of the higher diffusion constant of p-type boron in the p-type gate region 240 compared to n-type arsenic in the n-type gate region 242 allowing separation of the implanted species in the gate electrode 228 after thermal treatment into a second portion 246 which is heavily p-type doped, and the n-type gate region 242 which is heavily n-type doped.

In the remaining discussion of FIG. 2E, the portions of the gate electrode 228, shown as 286, 246, 242, and 229 in FIG. 2E may respectively be referred to as first portion 286, second portion 246, third portion 242, and the field plate 229. In the first portion 286 of the gate electrode 228 (the resurf region) the p-type doping density is low enough to allow depletion during operation of the DENMOS transistor 202 and allow it to function as a resurf region. The doping density of the field plate 229 may be equivalent to the doping density of the first portion 286. The second portion 246 of the gate electrode 228 is heavily p-type doped in the p-type gate region 240 (greater than $1\times10^{18}$ $cm^{-3}$) with a horizontal gradient to lighter doping until it is equivalent to the doping of the first portion 286 at the interface between the second portion 246 and the first portion 286. The heavily doped p-type gate region 240 of the second portion 246 of the gate electrode between the third portion 242, which is heavily n-type doped (greater than $1\times10^{18}$ $cm^{-3}$), and the first portion 286, which is lightly p-type doped, of the gate electrode 228 prevents n-type dopants of the third portion 242 from counter doping the p-type dopants of the first portion 286. While the overall doping of the third portion 242 is heavy, it may also have a horizontal gradient of doping with the heaviest doping at the source end of the gate electrode 228 and lighter doping at the interface between the third portion 242 and the second portion 246.

Figure 2F:
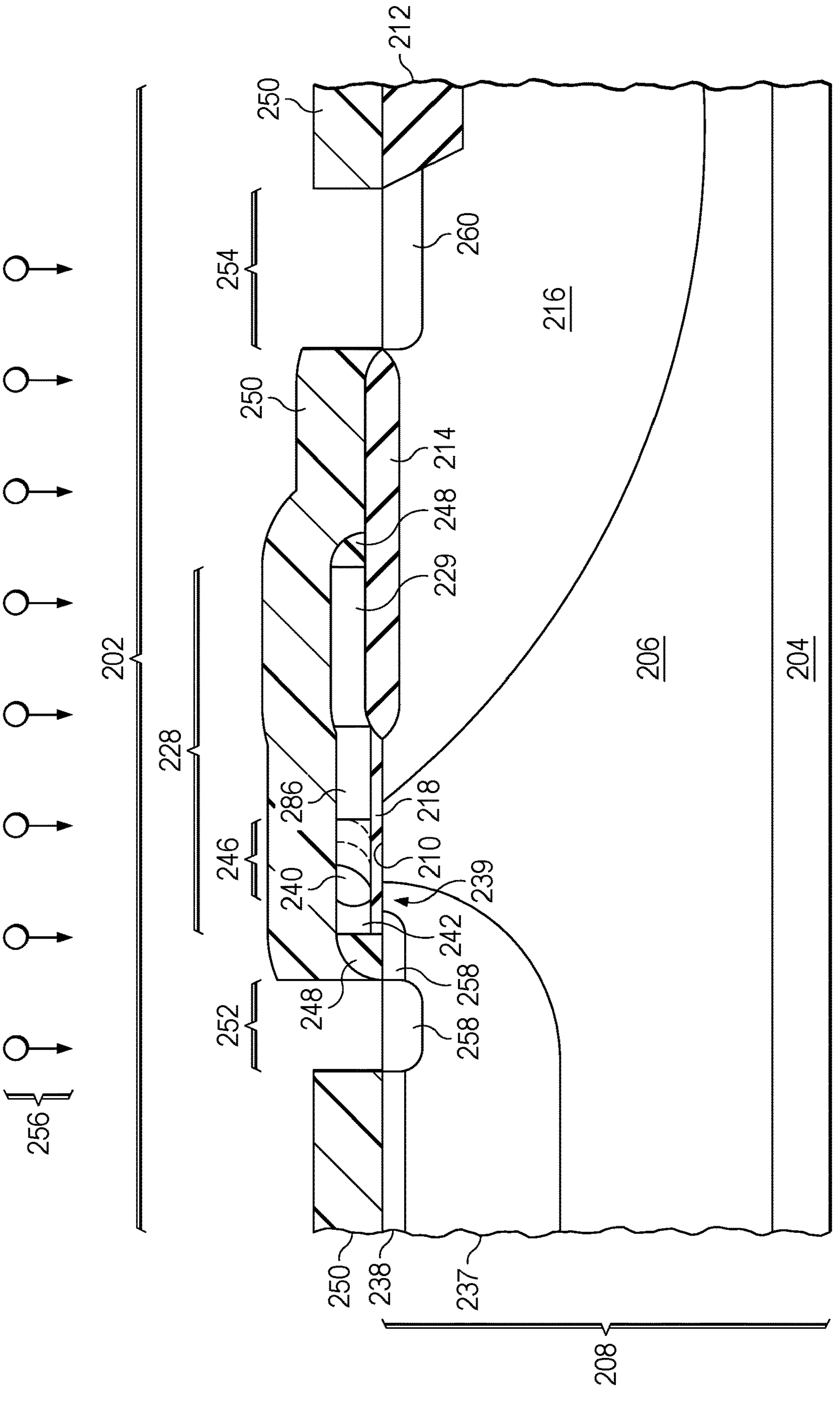

Referring to FIG. 2F, sidewall spacers 248 may be formed on the vertical surfaces of the gate electrode 228, and may extend 50 nm to 200 nm from the lateral edge of the gate electrode 228. After the formation of the sidewall spacers 248, a first source/drain resist 250 is deposited and patterned. A first source/drain implant 256 implants n-type dopants through a source opening 252 and a drain opening 254 into the substrate 208 to implant a source region 258 and a drain region 260. The first source/drain implant 256 may include one or more implant steps, with conditions such that resulting the source region 258 and the drain region 260, have a dopant concentration peaking between $1\times10^{19}$ $cm^{-3}$ and $1\times10^{21}$ $cm^{-3}$. The source region 258 and drain region 260 contain an average dopant density at least twice that of the epitaxial layer 206 with the peak doping density between 0.15 μm and 0.5 μm from the top surface 210 after a thermal anneal. After the formation of the source region 258 and the drain region 260, the source/drain resist 250 is removed and the wafer is thermally annealed (not specifically shown).

Figure 2G:
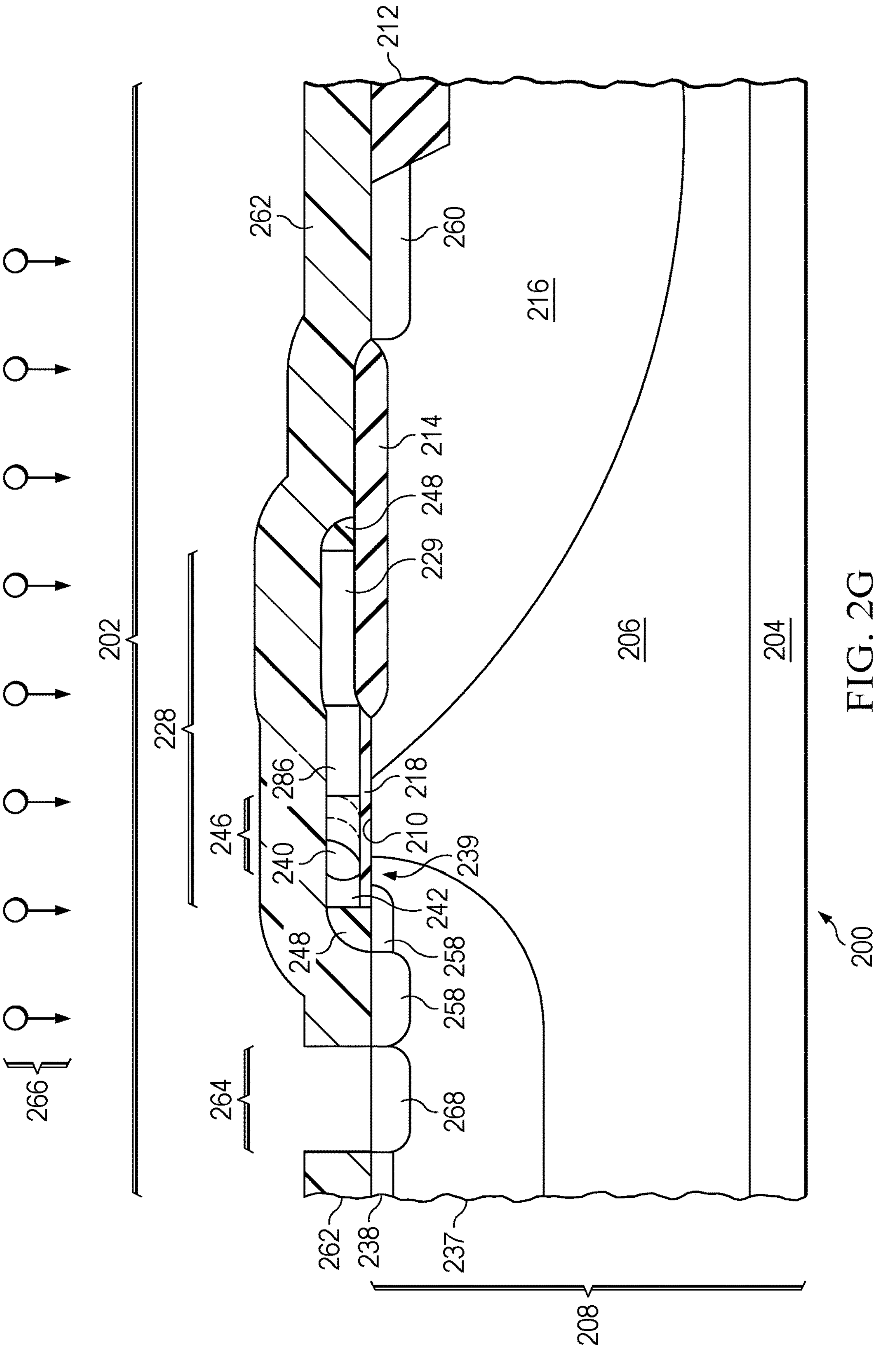

FIG. 2G refers to a cross section of the DENMOS transistor 202 after a second source/drain implant resist 262 is deposited and patterned to a form a second source/drain resist opening 264 for a second source/drain implant 266. The second source/drain implant 266 may implant dopants for a second source/drain region for p-channel devices (not specifically shown) of the microelectronic device 200. Additionally, the second source/drain implant 266 implants p-type dopants through the second source/drain resist opening 264 to form a back-gate contact 268 of the DENMOS transistor 202.

As with the first source/drain implant 256, the second source/drain implant 266 may occur in one or more steps. The second source/drain implant 266 may implant species including boron (or indium) with an overall dose and energy such that they provide degenerate doping, e.g., Having an active average dopant density greater than $1\times10^{19}$ $cm^{-3}$ near the solubility limit of the dopant atoms in back-gate contact 268. After the second source/drain implant 266, the second source/drain implant resist 262 is removed.

Figure 2H:
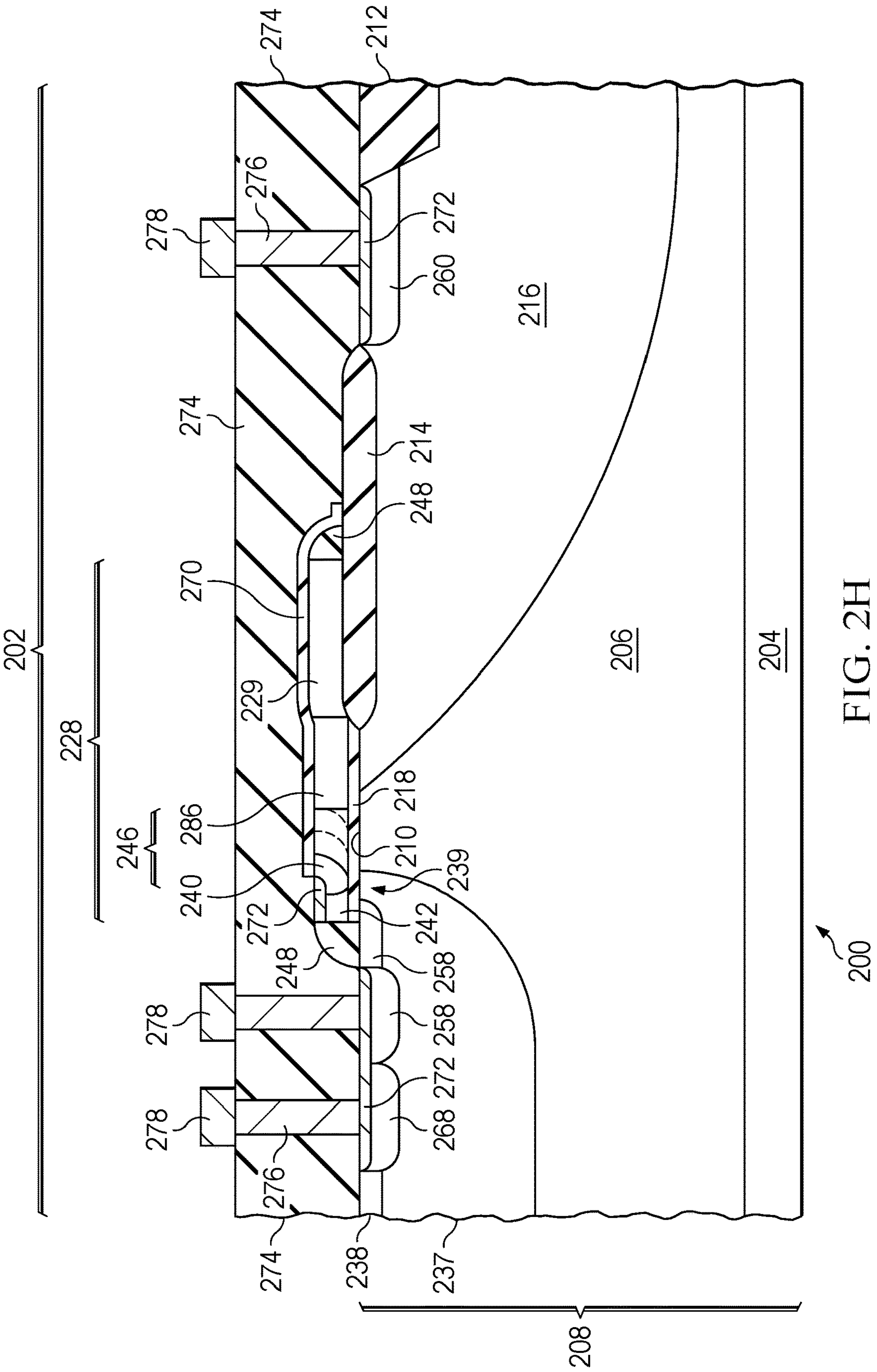

FIG. 2H shows a cross section of the DENMOS transistor 202 after a first level of interconnects 278 is complete. In some examples a silicide blocking layer 270 may be formed over the field plate 229 and the first portion 286 of the gate electrode 228, extending partially over the second portion 246 of the gate electrode 228, and leaving an area of the second portion 246 and the third portion 242 uncovered by the silicide blocking layer 270. The silicide blocking layer 270 may be formed by depositing one or more sublayers of an oxide, a nitride, an oxynitride, or any combination thereof over the entire wafer and patterning to open areas in which silicide formation is desired. In some examples, a metal silicide layer 272 may be formed on the source region 258, the drain region 260 and exposed portions of the gate electrode 228. The metal silicide layer 272 may provide ohmic electrical connections to the source region 258, the drain region 260, and the gate electrode 228 with lower resistances compared to a similar microelectronic device without metal silicide layer 272.

A PMD layer 274 is formed over the top surface 210 of the substrate 208. The PMD layer 274 may include one or more dielectric layers, such as silicon nitride, silicon oxynitride, silicon dioxide, or the like. In some examples, the PMD layer 274 includes a PMD liner and a main dielectric sublayer formed on the PMD liner. Subsequently, the PMD layer 274 may be planarized by a CMP process. Contacts 276, e.g. Tungsten plugs, are formed within the PMD layer 274 to provide electric connection to the source region 258 and the drain region 260. Interconnects 278 electrically connected to the contacts 276 are formed over the PMD layer 274 using any suitable metallization scheme and provide electrical contact between the DENMOS transistor 202 and other components of the microelectronic device 100.

Figure 3A:
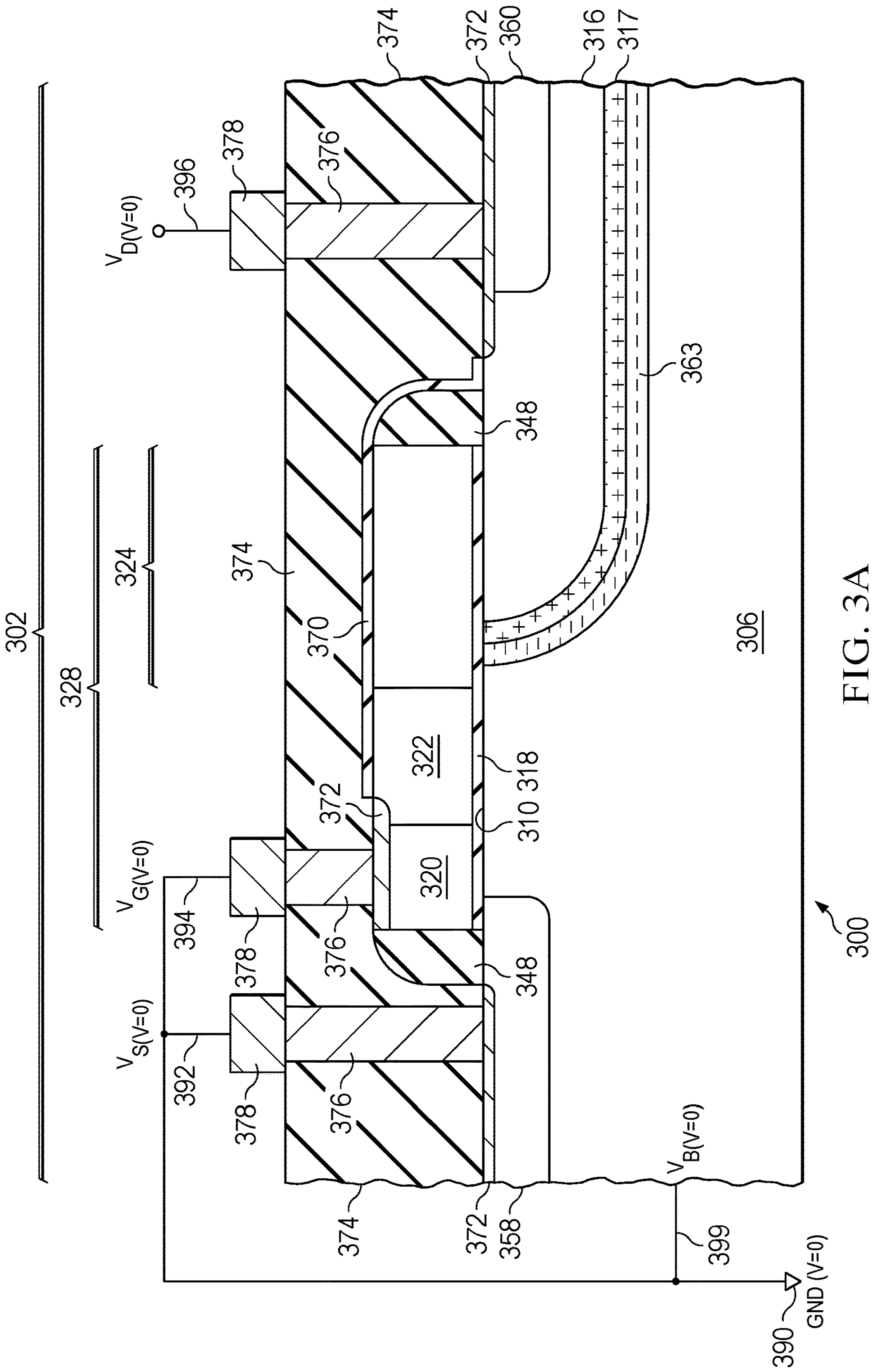
FIG. 3A is a graphical representation of an extended drain transistor with a depletable resurf gate electrode with a source and drain potential of 0 V.
Figure 3B:
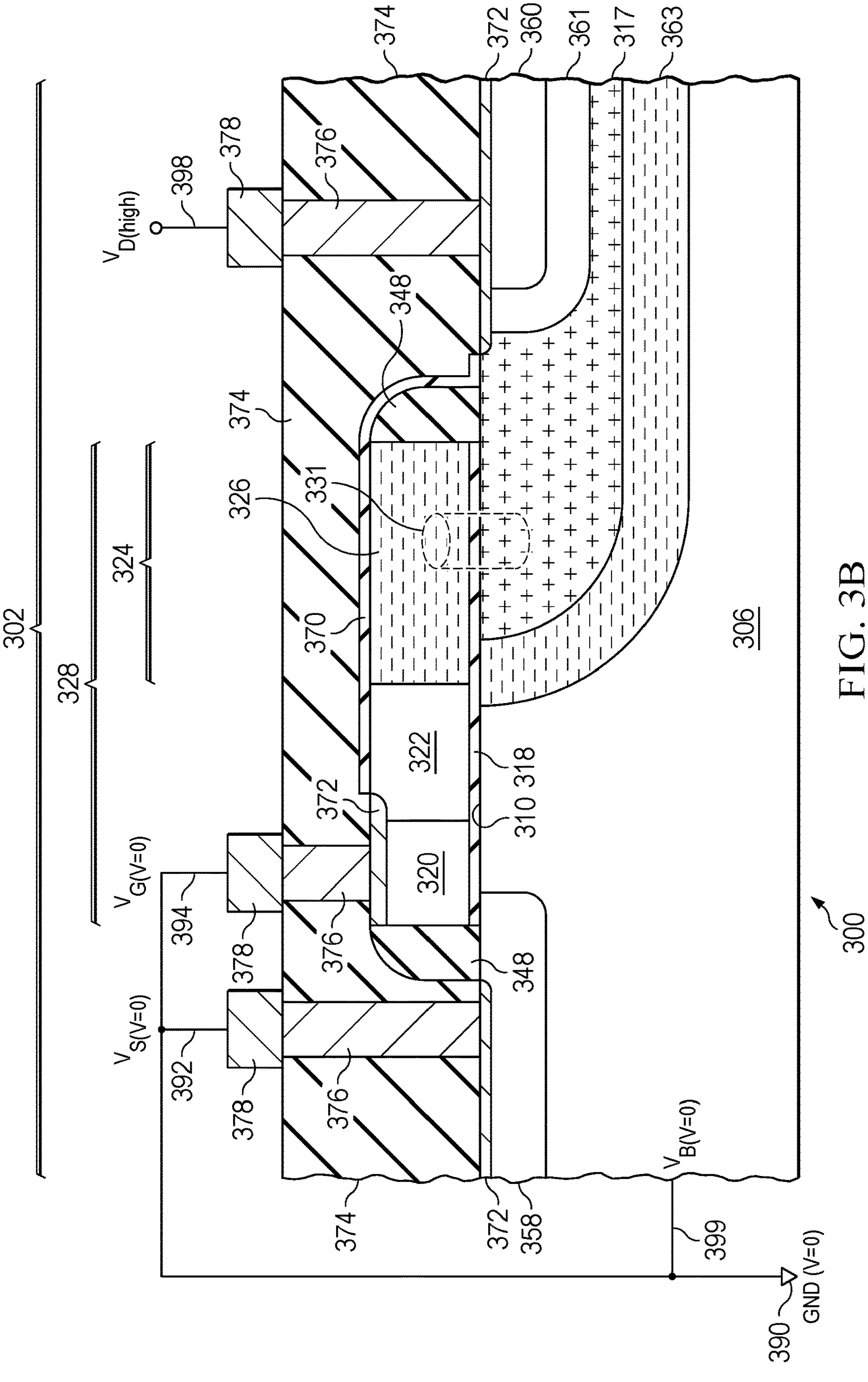
FIG. 3B is a graphical representation of an extended drain transistor with a depletable resurf gate electrode with a source potential of 0 V and drain potential of greater than 0 V (in a blocking state) demonstrating the depletable resurf effect of the depletable resurf gate electrode.

FIG. 3A and FIG. 3B are representations of an example microelectronic device 300 including a DENMOS transistor 302 with different applied voltages to the drain region 360. In FIG. 3A, the DENMOS transistor 302 is in a state with the source region 358 at zero applied voltage 392, the drain region 360 is at zero voltage 396, the gate electrode 328 is at zero voltage 394, and a body region 306 is at zero voltage 399. The source region 358, the drain region 360, and the gate electrode 328, all of which connect to ground 390, in parallel. There is a narrow depletion region at the interface between the n-drift region 316 and the body region 306 with a charge donor space 317 and acceptor charge space 363. Other narrow depletion regions which are not shown for simplicity include a narrow depletion region between the source region 358 and the body region 306, and a narrow depletion region between the third portion 320 and the second portion 322. With respect to FIG. 3A, each of the doped regions of the DENMOS transistor 302, have dopant concentrations as they were doped, e.g., The third portion 320 is heavily n-type doped, the second portion 322 is heavily p-type doped, and the first portion 324 is very lightly p-type doped. There is no potential applied to the system that disturbs the carrier profile in any of the doped regions from their as formed state. Other components of FIG. 3A include interconnects 378, contacts 376, a PMD layer 374, a silicide block layer 370, a silicide layer 372, sidewalls 348, a top surface 310 and a gate dielectric layer 318.

FIG. 3B shows the DENMOS transistor 302 in a blocking state, where the drain region 360 is held at a high reverse bias 398 with zero applied voltage 392 to the source region 358, zero voltage 394 to the gate electrode 328, and zero voltage to the body region 306, all of which connect to ground 390, in parallel. It may be advantageous in the DENMOS transistor 302, with the first portion 324 which is a lightly doped resurf region of the opposite type as the drain region 360, that in this configuration, the majority carriers in the drain end of the gate electrode may deplete under the action of the electric field caused by the reverse bias state of the drain region 360. The light doping (a dose below $1\times10^{13}$ $cm^{-2}$) of the first portion 324 allows a significant portion of the gate electrode 328 to be depleted when the drain region 360 is at a high reverse bias 398, turning the first portion 324 of the gate electrode 328 into a charged dielectric region that counterbalances the exposed charges in the underlying silicon due to the opposite doping sign. The cylinder 331 is similar to a Gaussian pillbox in which the charge of the portion of the cylinder 331 in the first portion 324 is equivalent to the charge in the portion of the cylinder 331 which is in the n-drift region 316. The high reverse bias 398 on the drain region forms an electron donor region 361 and the donor charge space 317. The first portion 324 and a portion of the body region 306 form an acceptor charge space 326 and 363 respectively, counter-balancing the donor charge space 317. The charge balance between the donor charge space 317, and the acceptor charge space 363 and the resurf region acceptor charge space 326 alleviates the high surface electric fields over the entire overlap region between the drain doping profile and the gate electrode 328, enabling the DENMOS transistor 302 to operate at high blocking drain voltages, with a high reverse bias 398 on the drain region 360 without the degradation effects of high local electric fields, especially when operating in pulsed mode.

The mutual depletion between the donor charge space 317, the acceptor charge space 363 and the resurf region acceptor charge space 326 is similar to the mutual depletion of an n-type layer and a p-type layer in a resurf drift region, so that the DENMOS transistor 302 employing the lightly doped first portion 324 is referred to as a depletable resurf gate electrode drain extended transistor.

Other components of FIG. 3B include interconnects 378, contacts 376, a PMD layer 374, a silicide block layer 370, a silicide layer 372, sidewalls 348, and a top surface 310.

Figure 4A:
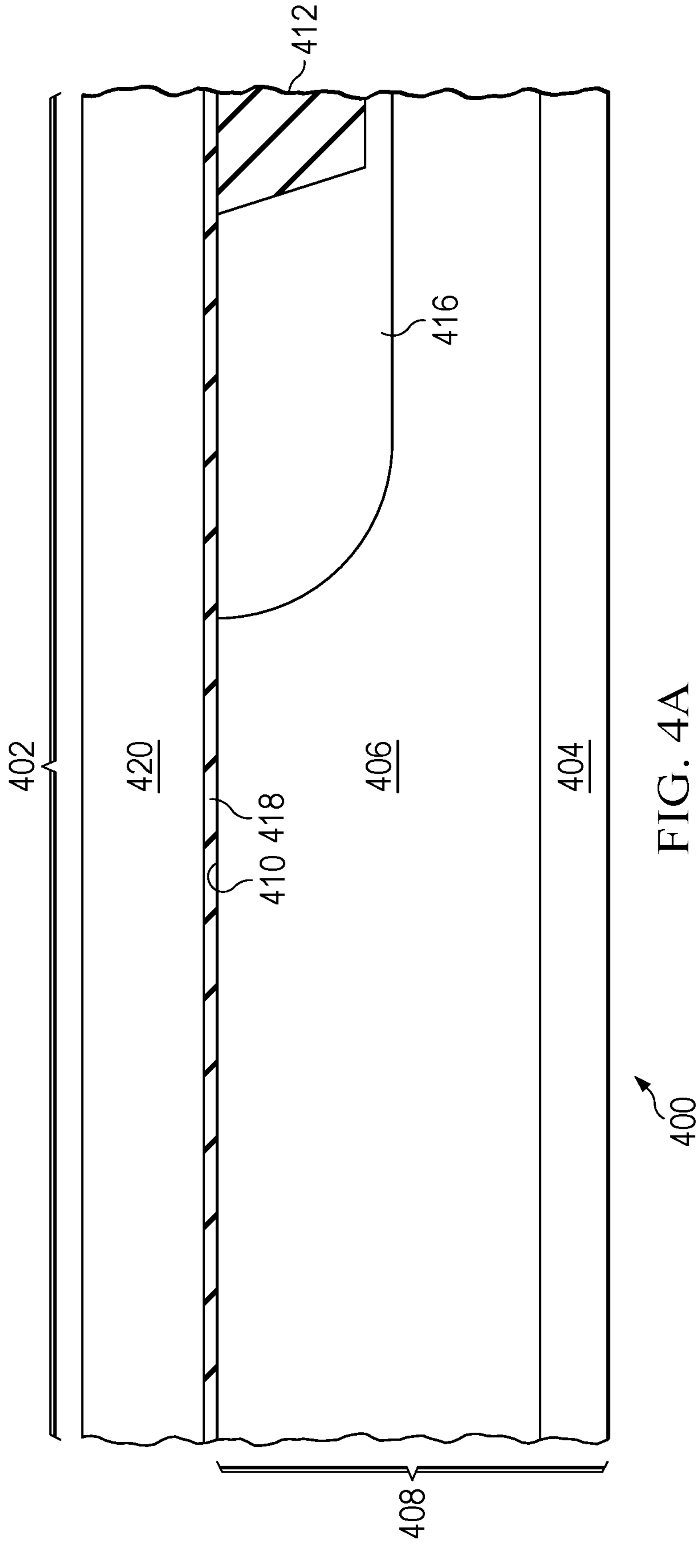
FIG. 4A through FIG. 4G are cross sections of an example microelectronic device including a transistor and a depletable resurf gate electrode formed using a self-aligned halo implant in various stages of formation.
Figure 4B:
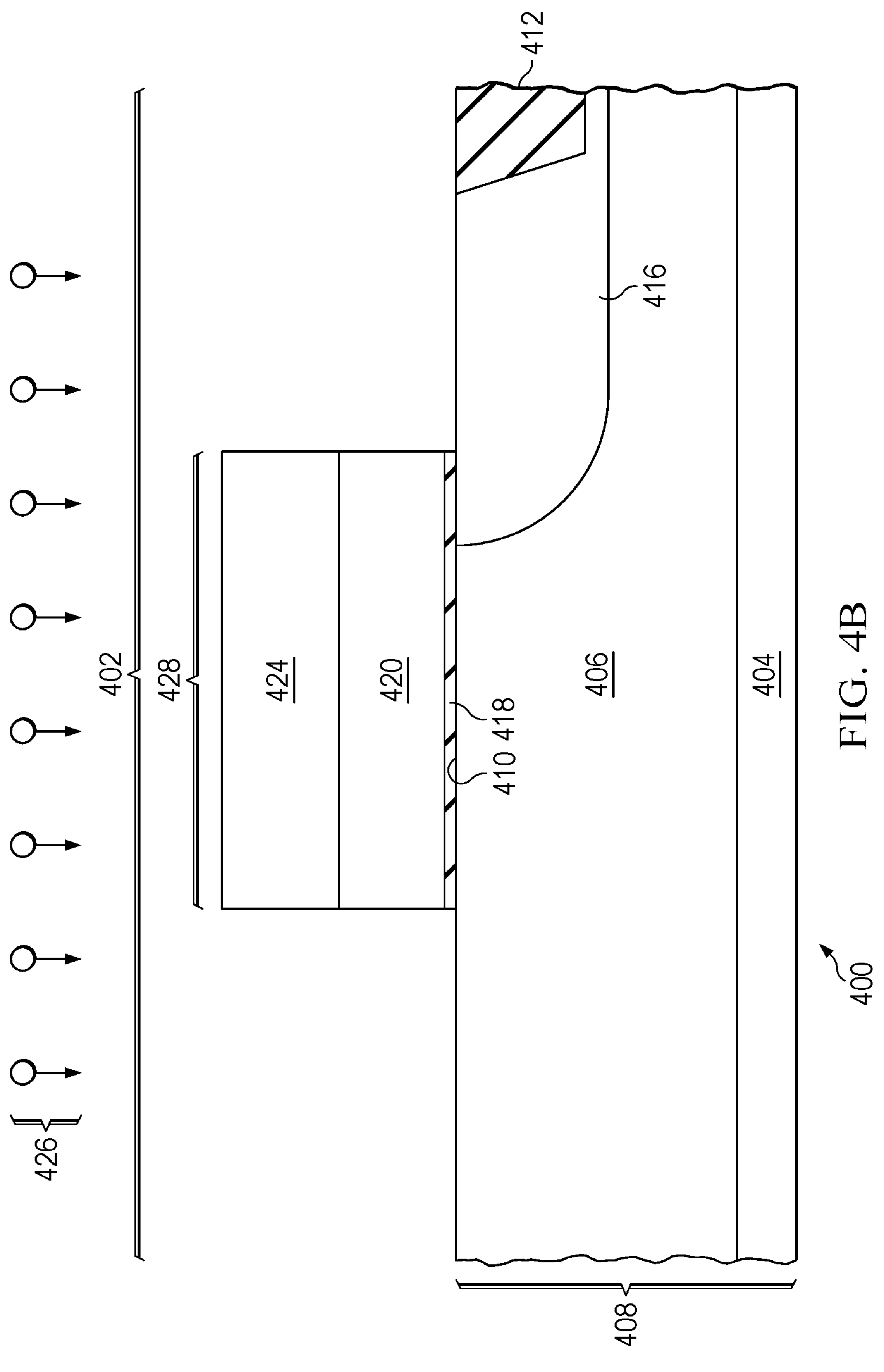

FIG. 4A through FIG. 4G are representative of a third type of electronic device to which the principles of the disclosure may be beneficially applied. These figures show cross sections of an example microelectronic device 400, e.g. A MOS transistor, including a depletable resurf gate electrode 428 (FIG. 4B, et seq.) Herein referred to as the gate electrode 428. Without implied limitation, the gate electrode 428 in this example is implemented in a DENMOS transistor 402 which is shown in successive stages of an example method of formation. Other implementations for the gate electrode 428 in a DEPMOS transistor are within the scope of this example. In the example DENMOS transistor 402, dopants of a first conductivity type are n-type dopants and dopants of a second conductivity type are p-type dopants. For the DENMOS transistor 402, halo implant is used as the self-aligned implant.

FIG. 4A shows the microelectronic device 400 including the DENMOS transistor 402 after the formation of a gate dielectric layer 418 and a gate layer 420. The structures and method within the microelectronic device 400 formed before the gate dielectric layer 418 formation may include an epitaxial layer 406 over a base wafer 404, together referred to as a substrate 408 with a top surface 410. The base wafer 404 may be p-type silicon with a dopant concentration of $1\times10^{17}$ $cm^{-3}$ to $1\times10^{19}$ $cm^{-3}$, for example. Alternatively, the base wafer 104 may be lightly doped, with an average dopant concentration below $1\times10^{16}$ $cm^{-3}$. The epitaxial layer 406 may be p-type silicon with a dopant concentration of $1\times10^{15}$ $cm^{-3}$ to $1\times10^{16}$ $cm^{-3}$, by way of example. The epitaxial layer 406 is optional in that the DENMOS transistor 402 may be formed directly in the base wafer 404 in some examples.

An isolation layer for the DENMOS transistor 402 may be formed by either by STI or LOCOS, either of which may be conventional or by any future-discovered method. The illustrated example includes STI structures 412.

A drift region 416 is formed in the substrate 408 in the epitaxial layer 106 and under a portion of the gate dielectric layer 418. One or more n-type implants are performed to form the drift region 416 (which may be referred to as an n-drift region) in the substrate 408. The n-type dopant that defines the n-drift region 416 may be implanted in one step or in multiple steps. For example, phosphorus may be implanted at a total dose of between $1\times10^{12}$ $cm^{-2}$ and $1\times10^{13}$ $cm^{-2}$ with energies suitable for forming the n-drift region 416 with or without subsequent thermal cycles. Arsenic may also be implanted with a similar dose with an energy relatively less than the phosphorus implant.

While not limited to the features discussed above in FIG. 4A which are formed in the substrate 408 of the DENMOS transistor 402, the gate dielectric layer 418 and gate layer 420 are formed over the top surface 410. The gate dielectric layer 418 may be formed in a high temperature furnace operation or a rapid thermal process. Other methods of forming the gate dielectric layer 418 are within the scope of this disclosure. The gate dielectric layer 418 may be any material and have any thickness appropriate to the technical application. The gate layer 420 is formed on the gate dielectric layer 418 by a conventional or future-discovered method. In the illustrated example, the gate layer 420 is formed by a deposition process using one or more silane-based precursors to deposit polycrystalline silicon (which may be referred to as polysilicon). In other examples, a replacement gate process may be used to form the gate layer 420. The gate layer 420 has a thickness that may range from approximately 50 nm to 300 nm. The gate layer 420 may be undoped or in situ doped as-deposited. In this example formation, the gate layer 120 is co-deposited with a p-type precursor such as (diborane, boron trichloride, Tris(2,4 pentanedionato)gallium(III)) such that the p-type dopant dose (the integral of net p-type doping concentration through the thickness of the gate electrode) is between $1\times10^{12}$ $cm^{-2}$ and $1\times10^{13}$ $cm^{-2}$. The low doping concentration in the gate layer 420, provides a resurf region to be defined at a later stage of processing.

The gate layer 420 may also be a poly-SiGe layer, a poly-Ge layer, a poly-SiC layer, or another semiconductor that can be grown or deposited on a gate dielectric.

FIG. 4B shows a cross section of the DENMOS transistor 402 after a gate resist 424 has been formed and after a gate plasma etch 426. The gate plasma etch 426 removes previously formed gate dielectric layer 418, and the gate layer 420 in areas not covered by the gate resist 424. The area under the gate resist 424 defines a gate electrode 428, the gate electrode 428 being the gate layer 420 and gate dielectric layer 418 remaining after the gate plasma etch 426. After the gate plasma etch 426 is complete, the gate resist 424 is removed and a wet or dry process may be used to clean the wafer surface.

Figure 4C:
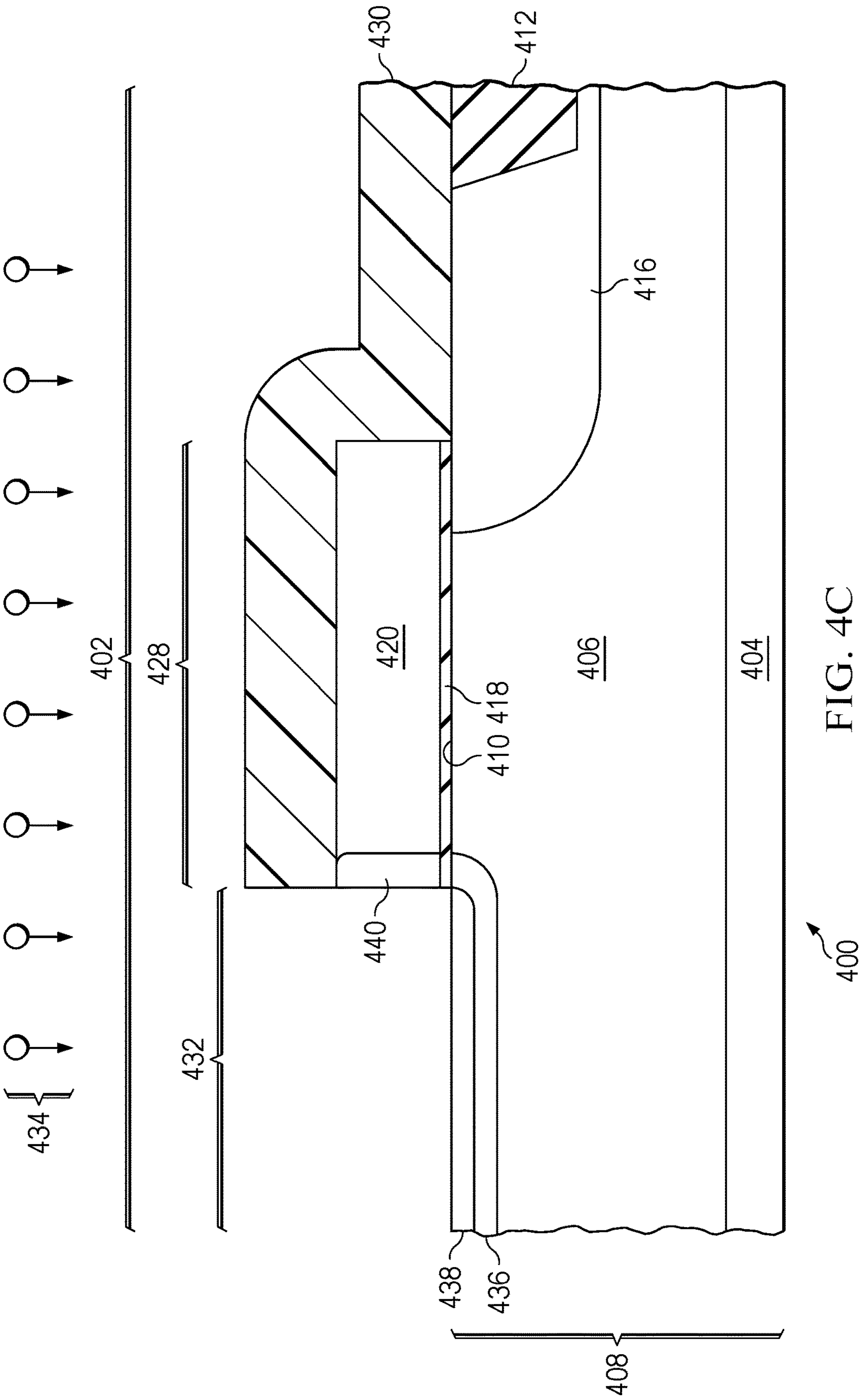

Referring to FIG. 4C, A halo implant resist 430 is formed. A self-aligned halo implant 434 may implant p-type and n-type ions through a halo resist opening 432 to form several implanted regions of the DENMOS transistor 402. The self-aligned halo implant 434 may consist of one or more p-type implants and one or more n-type implants. Some of the p-type implants may be angled up to 45 degrees to implant p-type ions into the vertical surface of the gate electrode 428. The p-type halo region 436 and p-type gate region 440 are implanted with p-type dopants which may include boron and/or indium. The p-type halo region 436 may have a peak dopant density of $1\times10^{19}$ $cm^{-3}$ or higher at a depth between 0.2 μm and 0.6 μm below the top surface 410 after a thermal anneal. The p-type gate region 440 may have a peak dopant density between $3\times10^{16}$ $cm^{-3}$ and $1\times10^{19}$ $cm^{-3}$. The p-type halo region 436 (in conjunction with the epitaxial layer 406 in some examples) may be referred to a body region (e.g., P-type body region) of the DENMOS transistor 402. The p-type gate region 440 forms a second portion 446 (referred to in FIG. 4D) of the gate electrode 428 after a thermal anneal. It may be advantageous to use the self-aligned halo implant 434 instead of the self-aligned DWELL implant 434 of the example device described in FIG. 1A-FIG. 1G if the microelectronic device 400 does not require a DWELL implant for other components (not specifically shown).

Additionally, in the substrate 408, the self-aligned halo implant 434 forms a n-type implant for the n-type lightly doped drain region 438. The n-type lightly doped drain region 438 is doped with n-type dopants which may include phosphorus or arsenic by way of example. The n-type lightly doped drain region 438 may have a peak dopant density between $3\times10^{16}$ $cm^{-3}$ and $1\times10^{19}$ $cm^{-3}$ at a depth between 0.05 μm and 0.3 μm below the top surface 410. After the self-aligned halo implant 434, the halo implant resist 430 is removed.

Figure 4D:
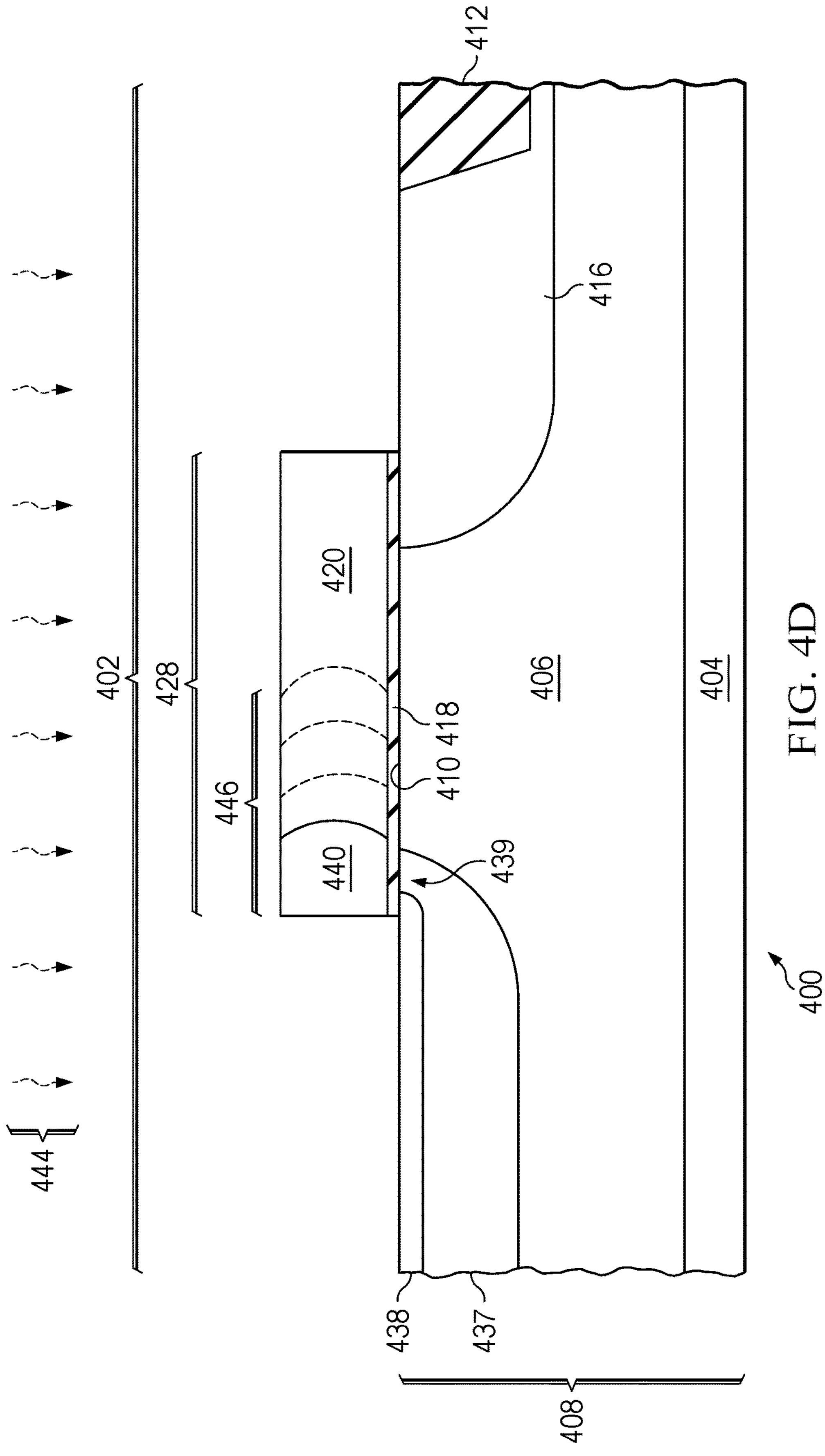

Referring to FIG. 4D, a thermal anneal step 444 may be used to activate and diffuse the implanted species from the self-aligned halo implant 434 thereby forming a DWELL 437. The DWELL 437 extends to the top surface 410 between the n-type well region 438 and the drift region 416 thereby providing a channel region 439 of the microelectronic device 400. A furnace or RTA process may be used as the heat source for the thermal anneal step 444. In the substrate 408, the thermal anneal provides the thermal budget for the p-type boron of the p-type lightly doped drain region 436 to diffuse past the n-type dopants of the n-type lightly doped drain region 438 to form the channel profile in the lateral direction. In the gate electrode 428, the thermal anneal step 444 takes advantage of the higher diffusion constant of p-type boron in the p-type gate region 440 leaving after thermal treatment into the second portion 446 which has a horizontal gradient of p-type doping, and a p-type gate region 440 which is heavily p-type doped.

In the remaining discussion of FIG. 4D, the portions 420, 446 of the gate electrode 428 may be referred to respectively as first portion 420, and second portion 446. In the first portion 420 of the gate electrode 428 (the resurf region) the p-type doping density is low enough to allow depletion during operation of the DENMOS transistor 402 and allow it to function as a resurf region. The second portion 446 of the gate electrode 428 is heavily p-type doped in the p-type gate region 440 with a horizontal gradient to lighter doping until it is equivalent to the doping of the first portion 420 at the interface between the second portion 446 and the first portion 420. The heavily doped p-type gate region 440 of the second portion 446 of the gate electrode is nearest the source and acts as the switching region for the DENMOS transistor 402.

Figure 4E:
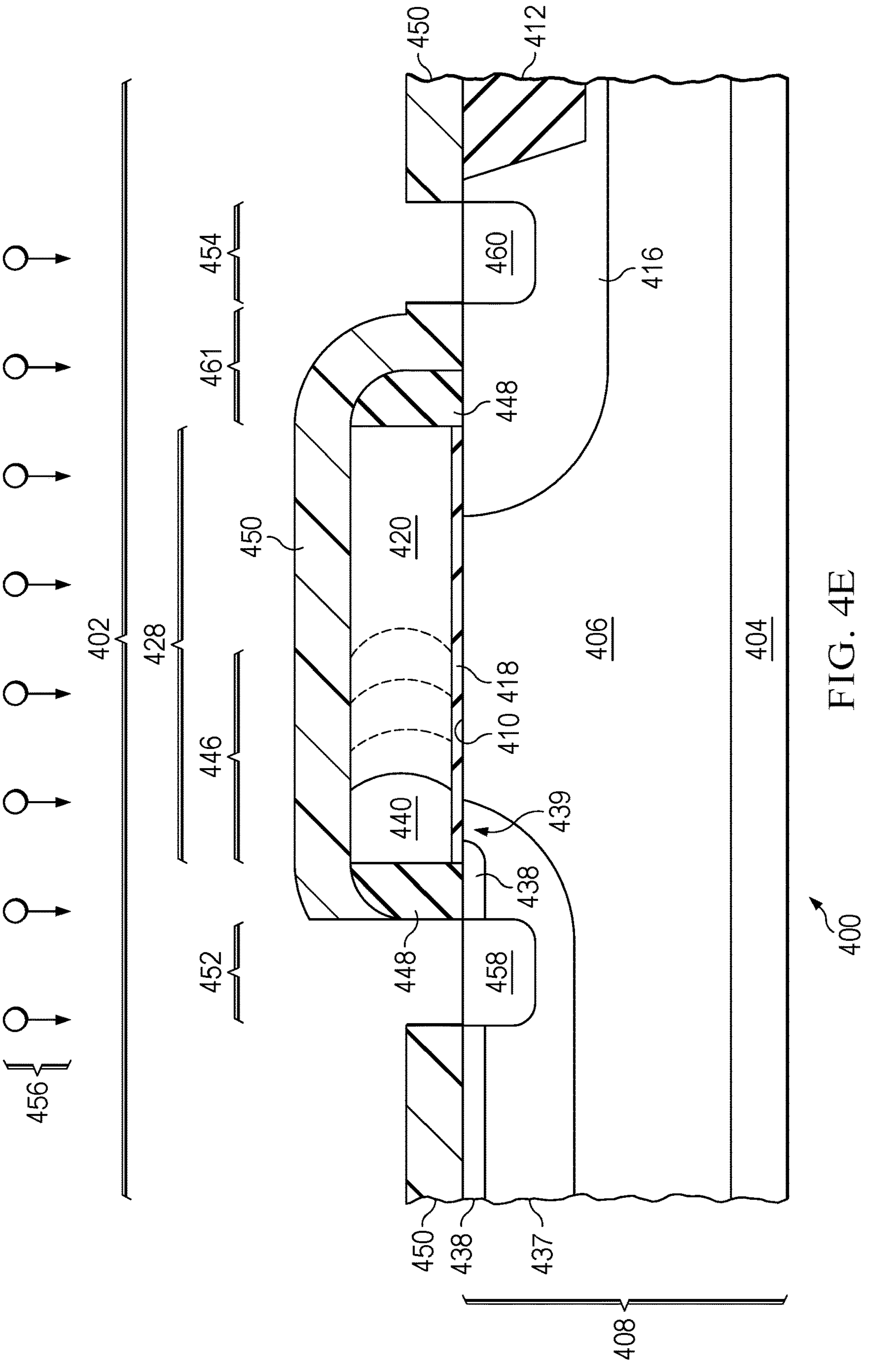

Referring to FIG. 4E, sidewall spacers 448 may be formed on the vertical surfaces of the gate electrode 428, and may extend 50 nm to 200 nm from the lateral edge of the gate electrode 428. After the formation of the sidewall spacers 448, a first source/drain resist 450 is deposited and patterned. A first source/drain implant 456 implants n-type dopants through a source opening 452 and a drain opening 454 into the substrate 408 to implant a source region 458 and a drain region 460. The first source/drain implant 456 may include one or more implant steps, with conditions such that resulting the source region 458 and the drain region 460, have a dopant concentration peaking between $1\times10^{19}$ $cm^{-3}$ and $1\times10^{21}$ $cm^{-3}$. The source region 458 and drain region 460 contain an average dopant density at least twice that of the epitaxial layer 406 with the peak doping density between 0.15 μm and 0.5 μm from the top surface 410. A source/drain resist extension 461 extends the first source/drain resist 450 past the end of the gate electrode 428 towards the drain region 460. The source/drain resist extension 461 prevents n-type dopants from the first source/drain implant 456 from extending under the gate electrode 428 after subsequent thermal annealing processes. After the formation of the source region 458 and the drain region 460, the source/drain resist 450 is removed and the wafer is thermally annealed (not specifically shown).

Figure 4F:
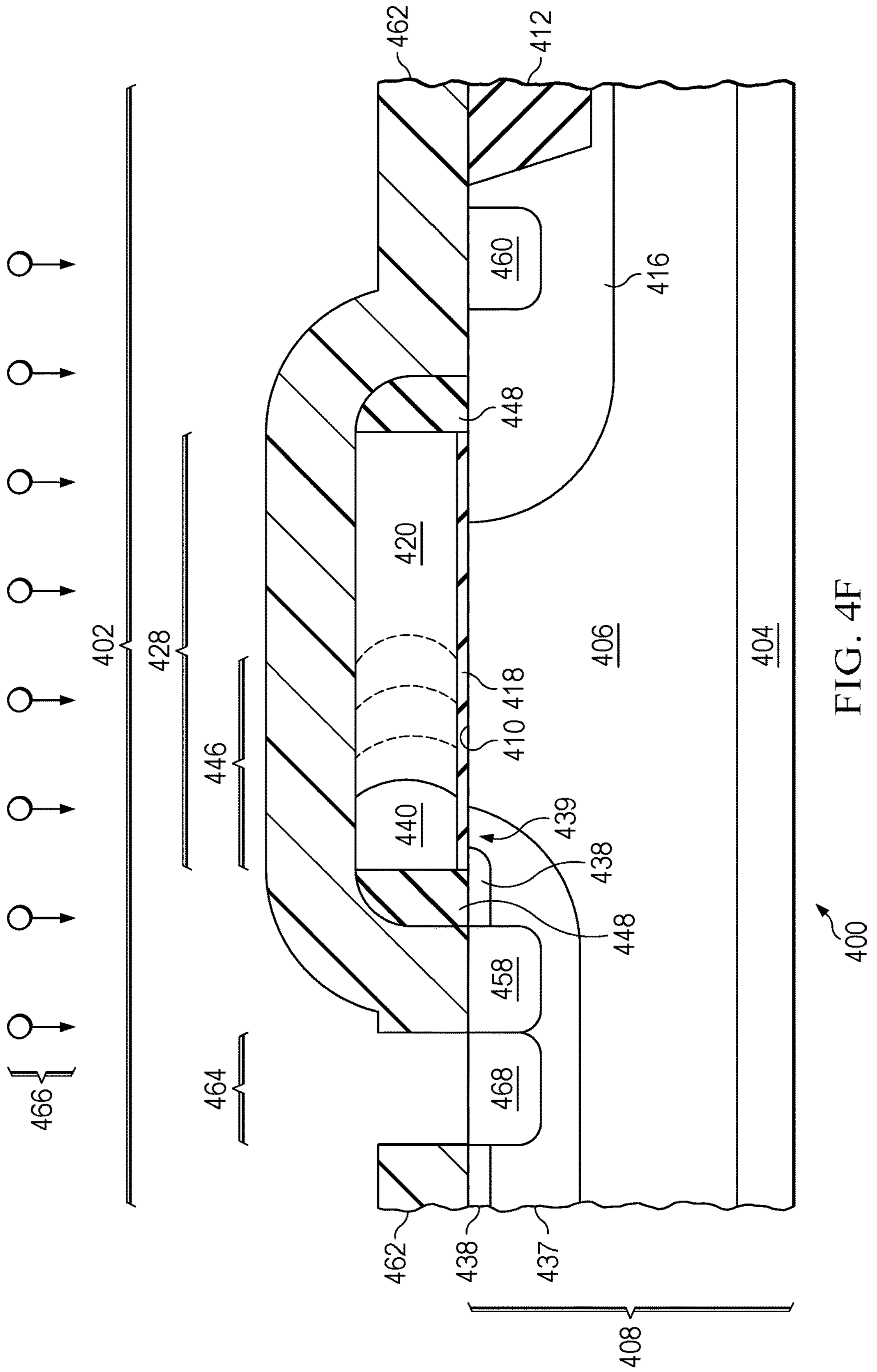

FIG. 4F refers to a cross section of the DENMOS transistor 402 after a second source/drain implant resist 462 is deposited and patterned to a form a second source/drain resist opening 464 for a second source/drain implant 466. The second source/drain implant 466 may implant dopants for a second source/drain region for p-channel devices (not specifically shown) of the microelectronic device 400. The second source/drain implant 466 implants p-type dopants through the second source/drain resist opening 464 to form the back gate region 468 of the DENMOS transistor 402. Additionally, the second source/drain implant resist 462 may contain an additional resist opening (not specifically shown) over the p-type gate region 440 which allows the second source/drain implant 466 to implant additional p-type dopants into the p-type gate region 440.

As with the first source/drain implant 456, the second source/drain implant 466 may occur in one or more steps. The second source/drain implant 466 may implant species including boron (or indium) with an overall dose and energy such that they provide degenerate doping, e.g., Having an active average dopant density greater than $1\times10^{19}$ $cm^{-3}$ near the solubility limit of the dopant atoms in back gate region 468. After the second source/drain implant 466, the second source/drain implant resist 462 is removed.

Figure 4G:
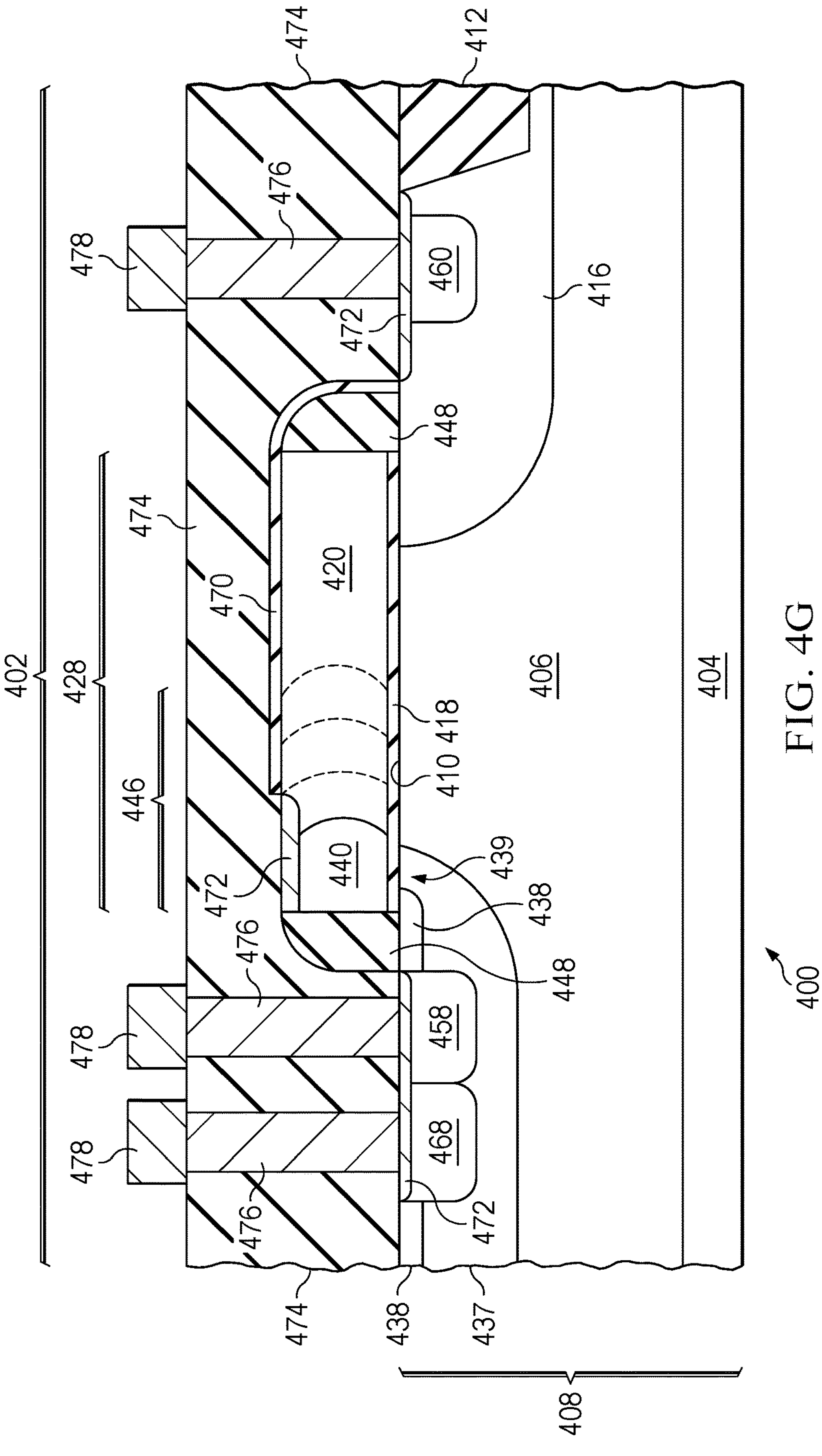

FIG. 4G shows a cross section of the DENMOS transistor 402 after a first level of interconnects 478 are complete. In some examples a silicide blocking layer 470 may be formed over the first portion 420 of the gate electrode 428, extending partially over the second portion 446 of the gate electrode 428, and leaving an area of the second portion 446 and uncovered by the silicide blocking layer 470. The silicide blocking layer 470 may be formed by depositing one or more sublayers of an oxide, a nitride, an oxynitride, or any combination thereof over the entire wafer and patterning to open areas in which silicide formation is desired. In some examples, a metal silicide layer 472 may be formed on the source region 458, the drain region 460, the back gate region 468 and exposed portions of the gate electrode 428. The metal silicide layer 472 may provide ohmic electrical connections to the source region 458, the drain region 460, the back gate region 468 and the gate electrode 428 with lower resistances compared to a similar microelectronic device without metal silicide layer 472.

A PMD layer 474 is formed over the top surface 410 of the substrate 408. The PMD layer 474 may include one or more dielectric layers, such as silicon nitride, silicon oxynitride, silicon dioxide, or the like. In some examples, the PMD layer 474 includes a PMD liner and a main dielectric sublayer formed on the PMD liner. Subsequently, the PMD layer 474 may be planarized by a CMP process. Contacts 476, e.g. Tungsten plugs, are formed within the PMD layer 474 to provide electric connection to the source region 458 and the drain region 460. Interconnects 478 electrically connected to the contacts 476 are formed over the PMD layer 474 using any suitable metallization scheme and provide electrical contact between the DENMOS transistor 402 and other components of the microelectronic device 400.

While various examples of the present disclosure have been described above, it should be understood that they have been presented by way of example only and not limitation. As such, although foregoing examples are described to use various resist layers (e.g., Photoresist or photomask layers) to perform various process steps (e.g., Implant steps or etch steps), the present disclosure is not limited thereto. For example, one or more hard masks (including one or more layers) may be patterned to define various regions for subsequent process steps to be applied (e.g., Regions for receiving dopant atoms, regions to block etchants). Moreover, the resist layers may include multi-level resists instead of a single-level resist in some examples. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the following claims and their equivalents.

What is claimed is:

1. A microelectronic device, comprising:

source and drain regions having a first conductivity type extending into a semiconductor substrate having an opposite second conductivity type;

a channel region having the second conductivity type extending between the source region and the drain region; and a gate electrode over the channel region and having first and second portions with the second conductivity type and a third portion with the first conductivity type, the first portion having a first dopant concentration, and the second portion extending from the first portion toward the source region and having a second higher dopant concentration, the second higher dopant concentration increasing from the first portion toward the source region, and the third portion extending from the second portion toward the source region.

2. The microelectronic device as recited in claim 1, further comprising a drain drift region of the first conductivity type that extends from the drain region toward the source region under the first portion, the drain drift region having an average dopant concentration less than the average dopant concentration of the drain region.

3. The microelectronic device as recited in claim 1, wherein the channel region is a part of a DWELL having the second conductivity type.

4. The microelectronic device as recited in claim 1, wherein the second portion has a second dopant concentration greater than $1\times10^{18}$ $cm^{-3}$ and the first portion has a first dopant dose less than $1\times10^{13}$ $cm^{-2}$.

5. The microelectronic device as recited in claim 1, further comprising a silicide blocking layer over the first portion of the gate electrode.

6. A method of forming a microelectronic device, comprising:

forming a gate electrode over a semiconductor substrate, the gate electrode having a source end and a drain end, a first portion of the gate electrode extending from the drain end toward the source end, a second portion extending from the first portion toward the source end, and a third portion extending from the second portion to the source end;

simultaneously implanting a first dopant of a first conductivity type in the third portion of the gate electrode and in the semiconductor substrate adjacent the source end of the gate electrode;

simultaneously implanting a second dopant of an opposite second conductivity type in the third portion of the gate electrode and in the semiconductor substrate adjacent the source end of the gate electrode; and thermally annealing the gate electrode such that the dopants of the second conductivity type diffuse from the third portion into the second portion of the gate electrode such that the second portion of the gate electrode has a horizontal dopant concentration gradient between the first and third portions of the gate electrode.

7. The method of claim 6, further comprising forming a source region having the first conductivity type spaced apart from the source end of the gate electrode, and a drain region having the first conductivity type spaced apart from the drain end of the gate electrode.

8. The method of claim 7, further comprising forming in the semiconductor substrate a drain drift region having the first conductivity type extending from the drain region toward the source region and ending under the first portion of the gate electrode, the drain drift region having an average dopant concentration less than an average dopant concentration of the drain region.

9. The method of claim 6, wherein a field plate extends from the drain end of the first portion of the gate electrode toward a drain region, and further comprising forming a field relief dielectric layer between the field plate and a drain drift region, the field relief dielectric layer having a thickness greater than a thickness of a gate dielectric layer.

10. The method of claim 6, wherein the first dopants are implanted with a dopant dose less than $10^{13}$ $cm^{-2}$ and the second portion of the gate electrode has an average second dopant concentration greater than $10^{18}$ $cm^{-3}$.

11. The method of claim 6, further comprising forming a silicide blocking layer over the first portion of the gate electrode.

12. The method of claim 6, further comprising forming an inorganic anti-reflective coating over the gate electrode.

13. A method of forming a microelectronic device, comprising:

forming a source region and a drain region having a first conductivity type extending into a semiconductor substrate having an opposite second conductivity type;

forming a gate electrode having first and second opposing ends over the semiconductor substrate between the source region and the drain region, wherein a first portion of the gate electrode extends from the first end toward the source region and a second portion of the gate electrode extends from the second end toward the drain region;

doping the first portion of the gate to have the second conductivity type;

implanting a dopant of the second conductivity type into the second portion at the second end of the gate electrode and into the semiconductor substrate adjacent the second end; and thermally annealing the gate electrode such that the dopant of the second conductivity type in the second portion of the gate electrode diffuses toward the first end thereby providing a horizontal gradient of the dopant in the second portion.

14. The method of claim 13, further comprising forming in the semiconductor substrate a drain drift region having the first conductivity type extending from the drain region toward the source region, extending under the first portion of the gate electrode, the drain drift region having an average dopant concentration less than an average dopant concentration of the drain region.

15. The method of claim 13, wherein a field plate extends from the first portion of the gate electrode toward the drain region, and further comprising forming a field relief dielectric layer between the field plate and a drain drift region, the field relief dielectric layer having a thickness greater than a thickness of a gate dielectric layer.

16. The method of claim 13, wherein the second portion has an average second dopant concentration greater than $1\times10^{18}$ $cm^{-3}$ and the first portion has a first dopant dose less than $1\times10^{13}$ $cm^{-2}$.

17. The method of claim 13, further comprising forming a silicide blocking layer over the first portion of the gate electrode.

18. The method of claim 13, further comprising implanting a dopant of the first conductivity type in the second portion of the gate electrode thereby forming a doped region of the gate electrode having the first conductivity type that extends from the second end toward the first end.

19. The method of claim 13, wherein the dopant is implanted through an inorganic anti-reflective coating.

* * * * *